US006672795B1

(12) United States Patent
Ellis et al.

(10) Patent No.: US 6,672,795 B1
(45) Date of Patent: Jan. 6, 2004

(54) SYSTEM AND METHOD FOR COUPLING MICROCOMPONENTS

(75) Inventors: Matthew D. Ellis, Allen, TX (US); George D. Skidmore, Plano, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 09/570,170

(22) Filed: May 11, 2000

(51) Int. Cl.$^7$ .................. H01R 16/627; A41F 1/100

(52) U.S. Cl. .................................. 403/327; 24/625

(58) Field of Search ................ 24/453, 297, 625; 403/326, 329

(56) References Cited

U.S. PATENT DOCUMENTS

| | | | |
|---|---|---|---|
| 3,439,416 A | 4/1969 | Yando | 29/625 |
| 3,268,774 A | 8/1969 | Ortner | |
| 3,467,942 A | 9/1969 | Dell et al. | |
| 4,141,138 A | 2/1979 | Quick | |
| 4,740,410 A | 4/1988 | Muller | 428/133 |
| 4,955,814 A | 9/1990 | Christie et al. | |
| 4,969,827 A | 11/1990 | Hahs, Jr. | |
| 5,113,117 A | 5/1992 | Brooks et al. | |
| 5,411,400 A | 5/1995 | Subrahmanyan et al. | |
| 5,539,200 A | 7/1996 | Lebby et al. | |
| 5,645,684 A | 7/1997 | Keller | 156/643.1 |
| 5,657,516 A | 8/1997 | Berg et al. | |
| 5,660,680 A | 8/1997 | Keller | 438/50 |
| 5,806,152 A | 9/1998 | Saitou | 24/662 |
| 5,818,748 A | 10/1998 | Bertin | 365/51 |
| 5,848,456 A | 12/1998 | Sjoqvist | |
| 6,154,936 A * | 12/2000 | Howell et al. | 24/625 |
| 6,263,549 B1 * | 7/2001 | Uehara | 24/625 |

FOREIGN PATENT DOCUMENTS

| | | |
|---|---|---|
| DE | 197 46 585 | 4/1999 |
| EP | 0 490 530 | 6/1992 |
| EP | 0 497 620 | 8/1992 |
| JP | 57 161819 | 10/1982 |
| WO | WO 97 13981 | 4/1997 |

OTHER PUBLICATIONS

A New Pick Up & Release Method By Micromanipulation, by Fumihito Arai and Toshio Fukuda, Jan. 1997.

(List continued on next page.)

Primary Examiner—Lynne H. Browne
Assistant Examiner—John R. Cottingham
(74) Attorney, Agent, or Firm—Fulbright & Jaworski L.L.P.

(57) ABSTRACT

A system and method which provide a general-purpose snap connector suitable for coupling microcomponents are disclosed. A snap connector is disclosed that is suitable for performing general assembly, including out-of-plane, 3-D assembly of microcomponents, wherein such microcomponents may be securely coupled together. That is, a snap connector is disclosed which enables microcomponents to be coupled in a manner that constrains undesirable movement of the coupled components relative to each other. Preferably, such a snap connector may be pressure fit with a receptacle (or aperture) of a mating component in a manner that constrains translational and rotational degrees of freedom of the mating component relative to the snap connector. A preferred embodiment provides a "preloaded" snap connector that may be utilized to perform general assembly of microcomponents. An alternative embodiments provides a non-preloaded snap connector suitable for performing general assembly of microcomponents. Still a further alternative embodiment provides a "squeeze" snap connector that is suitable for performing general assembly of microcomponents. Such snap connectors may be implemented as an integrated part of a microcomponent, or they may be implemented as separate, stand-alone snap connectors. For example, a dual-ended snap connector is disclosed herein, which may be coupled to a first microcomponent, and then used to couple the first microcomponent to a second microcomponent.

97 Claims, 12 Drawing Sheets

OTHER PUBLICATIONS

Design, Fabrication, and Characterization of Single Crystal Silicon Latching Snap Fasteners for Micro Assembly, by Rama Prasad et al., Nov. 1995.

Fluidic Self–Assembly of Microstructures and its Application to the Integration of GaAs on Si, by Hsi–Jen J. Yeh and John S. Smith, Jan. 1994.

Hexsil Tweezers for Teleoperated Microassembly, by C. G. Keller and R. T. Howe, Jan. 1997.

Microassembly Technologies for MEMS, by Michael B. Cohn et al.

Microfabricated High Aspect Ratio Silicon Flexures, by Chris Keller, 1998.

Self–Assembling Electrical Networks: An Application of Micromachining Technology, by Michael B. Cohn et al., May 1991.

Surface–Micromachined Components for Articulated Microrobots, by Richard Yeh, et al., Mar. 1996.

Survey of Sticking Effects for Micro Parts Handling, by Ronald S. Fearing, Apr. 1995.

Jurgend Mohr: "LIGA–A Technology for Fabricating Microstructures and Microsystems,"0 Sensors and Materials, vol. 10, No. 6, 1998, pp. 363–373, XP00878653 Tokyo.

IBM Technical Disclosure Bulletin, "Chip–to–Chip Cable Connection," Apr. 1985, vol. 27, No. 11.

Abstract of JP 57 161819A, Patent Abstracts of Japan vo. 007, No. 002 (p. 166) Jan. 7, 1983.

\* cited by examiner

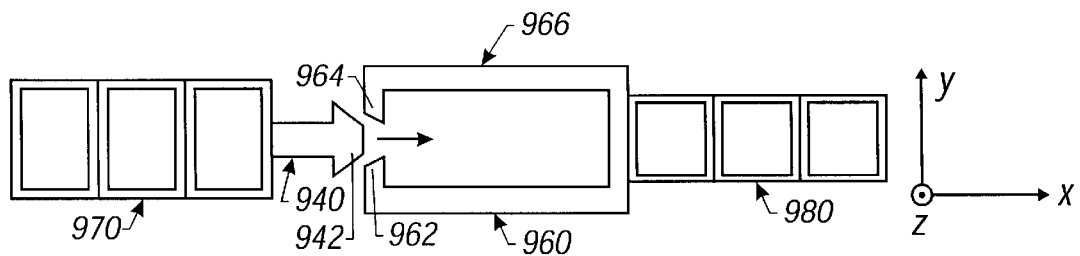
FIG. 9A
(Prior Art)
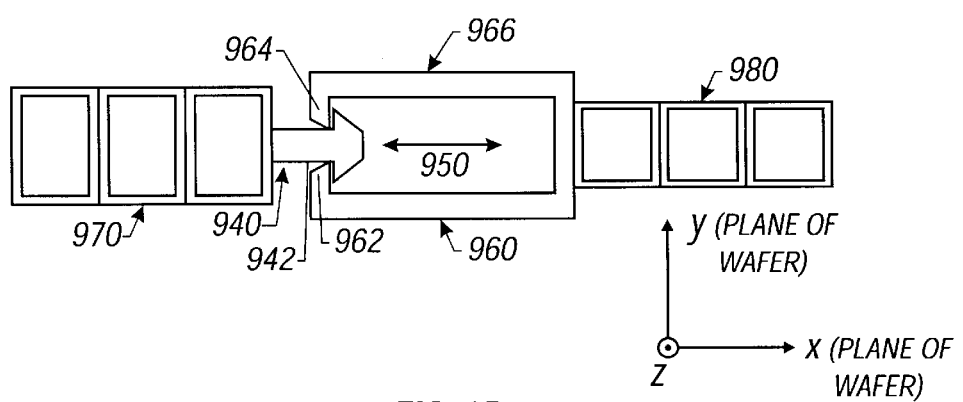
FIG. 9B
(Prior Art)
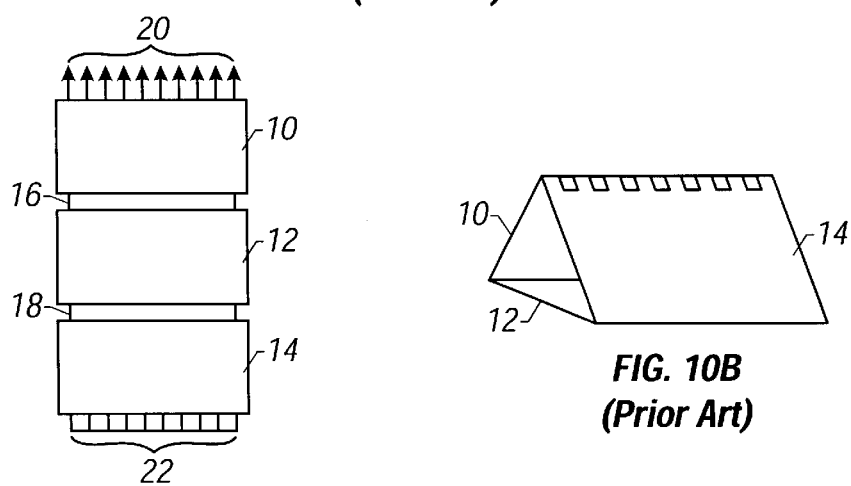
FIG. 10A
(Prior Art)
FIG. 10B
(Prior Art)

SYSTEM AND METHOD FOR COUPLING MICROCOMPONENTS

RELATED APPLICATIONS

This application is related to concurrently filed and commonly assigned U.S. patent application Ser. No. 09/569,330 filed May 11, 2000, entitled "METHOD AND SYSTEM FOR SELF-REPLICATING MANUFACTURING STATIONS," Ser. No. 09/569,329 filed May 11, 2000, entitled "GRIPPER AND COMPLEMENTARY HANDLE FOR USE WITH MICROCOMPONENTS," and Ser. No. 09/549,328 filed May 11, 2000, entitled "RIBBON CABLE AND ELECTRICAL CONNECTOR FOR USE WITH MICROCOMPONENTS," the disclosures of which are hereby incorporated herein by reference.

TECHNICAL FIELD

The present invention relates in general to mechanisms for coupling two components, and in specific to connectors for coupling microcomponents.

BACKGROUND

Extraordinary advances are being made in micromechanical devices and microelectronic devices. Further, advances are being made in MicroElectroMechanical ("MEMs") devices, which comprise integrated micromechanical and microelectronic devices. The terms "microcomponent" and "microdevice" will be used herein generically to encompass microelectronic components, micromechanical components, as well as MEMs components. A need exists in the prior art for a mechanism for coupling microcomponents. For example, a need exists for some type of mechanical connector that provides either a permanent mechanical coupling or a temporary coupling between two or more microcomponents.

Generally, microcomponent devices are devices having a size below one millimeter by one millimeter. Although, microcomponents as large as one centimeter by one centimeter have been provided in the prior art. Moreover, microcomponents may be smaller than one millimeter by one millimeter in size. Furthermore, techniques for fabricating microcomponents typically produce such microcomponents having a minimum feature size of approximately one micron. Although, such microcomponents may be implemented with a minimum feature size of greater or less than one micron.

Various types of coupling mechanisms are well known for large scale assembly. For example, mechanisms such as screws, bolts, rivets, snap connectors, and a variety of other types of coupling mechanisms are well known and commonly used for coupling large scale components. However, such coupling mechanisms for large scale components are very difficult to implement on the small scale necessary for coupling microcomponents. That is, many large scale coupling mechanisms are unacceptable and are not easily adaptable for coupling microcomponents.

Microcomponents, such as MEMs, are generally fabricated as two dimensional ("2-D") components. That is, microcomponents generally have a defined 2-D shape (e.g., defined X dimension and Y dimension), but the third dimension (e.g., the Z dimension) is generally set for the entire part. Limited control over the Z dimension may be achieved by using multiple layers in microcomponent designs. Although, any given layer of the microcomponent is a given thickness. Thus, a more desirable method to alter the Z dimension, is to combine microcomponent parts together.

One prior art technique commonly used for assembling microcomponents, such as MEMs, is serial microassembly, which may also be referred to as "pick and place" assembly. With serial microassembly, each device is assembled together one component at a time, in a serial fashion. For example, if a device is formed by combining two microcomponents together, a placing mechanism is used to pick up one of the two microcomponents and place it on a desired location of the other microcomponent. While such a serial microassembly technique using pick and place operations initially appears to be a simple technique, when working with microcomponents, such pick and place operations are very complex. For microassembly, the relative importance of the forces that operate is very different from that in the macro world. For example, gravity is usually negligible, while surface adhesion and electrostatic forces dominate. (See e.g., *A survey of sticking effects for micro parts handling*, by R. S. Fearing, IEEE/RSJ Int. Workshop on Intelligent Robots and Systems, 1995; *Hexsil tweezers for teleoperated microassembly*, by C. G. Keller and R. T. Howe, IEEE Micro Electro Mechanical Systems Workshop, 1997, pp. 72–77; and *Microassembly Technologies for MEMS*, by Micheal B. Cohn, Karl F. Böhringer, J. Mark Noworolski, Angad Singh, Chris G. Keller, Ken Y. Goldberg, and Roger T. Howe). Due to scaling effects, forces that are insignificant at the macro scale become dominant at the micro scale (and vice versa). For example, when parts to be handled are less than one millimeter in size, adhesive forces between a gripper and an object can be significant compared to gravitational forces. These adhesive forces arise primarily from surface tension, van der Waals, and electrostatic attractions and can be a fundamental limitation to handling of microcomponents. While it is possible to fabricate miniature versions of conventional robot grippers in the prior art, overcoming adhesion effects for such small-scale components has been a recognized problem.

Often in attempting to place a microcomponent in a desired location, the component will "stick" or adhere to the placing mechanism due to the aforementioned surface adhesion forces present in microassembly, making it very difficult to place the component in a desired location. (See e.g. *Microfabricated High Aspect Ratio Silicon Flexures*, Chris Keller, 1998). For example, small-scale "tweezers" (or other types of "grippers") are used to perform such pick and place operations of serial microassembly, and often a component will adhere to the tweezers rather than the desired location, making placing the component very difficult. It has been recognized in the prior art that to grip microcomponents and then attach them to the workpiece in the desired orientation, it is essential that a hierarchy of adhesive forces be established. For instance, electrostatic forces due to surface charges or ions in the ambient must be minimized. Adhesion of the micropart to the unclamped gripper surfaces (with zero applied force) should be less than the adhesion of the micropart to the substrate, to allow precise positioning of the part in the gripper.

Accordingly, unconventional approaches have been proposed for performing the pick and place operations. For example, Arai and Fukada have built manipulators with heated micro holes. See *A new pick up and release method by heating for micromanipulation*, by F. Arai and T. Fukada, IEEE Micro Electro Mechanical Systems Workshop, 1997, pp. 383–388). When the holes cool, they act as suction cups whose lower pressure holds appropriately shaped objects in place. Heating of the cavities increases the pressure and causes the objects to detach from the manipulator. Alternatively, some type of external adhesive (e.g., a type of liquid "glue") may be utilized to enable the microcomponent to be placed in a desired location. That is, because the components themselves provide no mechanism for coupling, an external adhesive may be required to overcome the adhesive force between the component and the placing mechanism (e.g., tweezers). For example, the target spot on the workpiece may have a surface coating that provides sufficiently strong adhesion to exceed that between the micropart and the unclamped gripper.

Another prior art technique commonly used for assembling microcomponents, such as MEMs, is parallel microassembly. In parallel microassembly, components of one wafer are coupled to components of another wafer simultaneously in a single step. For example, the above pick and place operations may be performed on an entire wafer, such that one wafer is picked up and placed onto another wafer, thereby coupling the components of one wafer with the components of the other wafer. Therefore, parallel assembly involves the simultaneous precise organization of an ensemble of microcomponents. This can be achieved by microstructure transfer between aligned wafers or arrays of binding sites that trap an initially random collection of parts. Binding sites can be micromachined cavities or electrostatic traps; short-range attractive forces and random agitation of the parts serve to fill the sites.

Parallel microassembly techniques may be categorized as either "deterministic" or "stochastic," depending on whether the microcomponents are initially organized. There are two general approaches to parallel microassembly in the prior art, one based on the massively parallel transfer between wafers of arrays of microcomponents (i.e., "deterministic parallel microassembly") and one utilizing various approaches to orient an initially random array of microcomponents (i.e., "stochastic parallel microassembly"). Deterministic parallel microassembly refers to direct, wafer-to-wafer transfer of microcomponents. Since the placement of the microcomponents is predetermined by their layout on the donor wafer, the challenge with such process typically lies in bonding the components to the target. A common technique for bonding the components utilizes solder bumps to achieve such bonding.

While conventional assembly techniques have been successfully adapted from the macro world, the molecular regime offers many examples of efficient assembly processes. Crystal growth, antibody-antigen recognition, and most other chemical and biological behaviors are mediated by thermal motion and interparticle forces. In contrast to the macroscopic concepts of manipulators and path planning, a molecular system may be analyzed as an ensemble of particles evolving toward a state of minimal potential energy. The lure of this thermodynamic approach is that when parts must be redistributed or reoriented, a single complex manipulator may be replaced by an array of lithographically-defined binding sites. Such sites might consist of electrostatic traps, or simply etched wells on a substrate. Thermodynamic analysis shows the potential for massively parallel operation forming assemblies $10^6$ or more elements in seconds, with placement tolerance limited by lithographic accuracy. Historically, stochastic assembly precedes MEMS by several decades. One of the best illustrations is the work of Yando disclosed in U.S. Pat. No. 3,439,416 entitled "Method and Apparatus for Fabricating an Array of Discrete Elements" issued in 1969, which discloses an array of magnets on which particles with magnetic coatings are placed, vibrated, and trapped so as to form a matching array. Each particle is described as a microelectronic device, such as a diode. One problem with this scheme is that the magnet arrays are composed of laminated sheets stacked perpendicularly to the place of the array, so that many laminations are needed to achieve an array of appreciable extent. A further example is the APOS parts feeder described by Hitakawa. (See *Advanced Parts Orientation System Has Wide Application*, by H. Hitakawa, Assembly Automation, 8(3), 1988). The feeder uses an array of "berths" cut into a vibrating plate. Parts are fed over the plate, and the berths are designed, like the track of the bowl feeder, to accept only parts in a given orientation. Eventually, all the berths are filled. Various stochastic assembly "wet processes" have also been proposed. (See e.g., *Fluidic Self-assembly of Microstructures and its Application to the Integration of GaAs on Si*, by H. J. Yeh and J. S. Smith, Proceedings IEEE Micro Electro Mechanical Systems, Oiso, Japan, Jan. 25–28, 1994/New York: IEEE, 1994, p. 279–84; and *Self-Orienting Fluidic Transport* (*SOFT*) *Assembly of Liquid Crystal Displays*, by M. A. Hadley, presentation at the Defense Manufacturing Conference, Palm Springs, Calif., Dec. 1–4, 1997). Additionally, various stochastic assembly "dry processes" have been proposed. For example, in 1991, Cohn, Kim, and Pisano described stochastic assembly using vibration and gravitational forces to assemble arrays of up to 1000 silicon chiplets. (See *Self-Assembling Electrical Networks: An Application of Micromachining Technology*, by M. Cohn, C. J. Kim, and A. P. Pisano, Transducers 91 International Conference on Solid-State Sensors and Actuators, Digest of Technical Papers, San Francisco, Jun. 24–27, 1991/New York: IEEE, 1991, p. 493).

Snap connectors have been proposed in the prior art as a mechanism for coupling MEMs components (see e.g., *Design, Fabrication, and Characterization of Single Crystal Silicon Latching Snap Fasteners for Micro Assembly*, by Rama Prasad, Karl-Friedrich Böhringer, and Noel C. MacDonald, Proc. ASME Int. Mech. Eng. Congress and Exposition, 1995). A snap connector as proposed in the prior art is shown in FIGS. 9A and 9B. As shown in FIG. 9A, a snap connector 940 having an "anchor" (or "barbed end") 942 is coupled to a component 970. Furthermore, a mating component 960 coupled to a different component 980 is provided, which includes "latches" 962 and 964. The snap connector 940 of the prior art is moved linearly along the plane of the wafer (i.e., along the X axis of FIGS. 9A and 9B) to enable the component 970 to be coupled to the component 980 within the plane of the wafer. FIG. 9B illustrates such a coupling.

Thus, snap connectors have been proposed that are capable of coupling MEMs components. However, the snap connectors of the prior art are designed to only work in the plane of the wafer on which the components are located (i.e., along the X and Y axes of FIGS. 9A and 9B. Thus, the snap connectors of the prior art do not provide a mechanism for general assembly, but rather are only capable of coupling components in the plane of the wafer. Thus, for example, no mechanism has been disclosed in the prior art for using a snap connector for connecting a component perpendicular to the surface of a wafer to achieve 3-D assembly. That is, prior art snap connector implementations do not provide a mechanism suitable for general coupling of two microcomponents, but rather only allow for coupling of microcomponents in-plane (i.e., to achieve only 2-D assembly).

Additionally, the in-plane snap connector of the prior art lacks many characteristics that may be desired for a general coupling mechanism. For example, as shown in FIG. 9B, the snap connector works to prevent the components 970 and 980 from becoming uncoupled by a movement within the plane of the wafer (i.e., by a movement in the X or Y direction of FIGS. 9A and 9B). Although, the mating component 960 includes area 950, which permits a certain amount of "play" between the components along the X axis of FIGS. 9A and 9B. Thus, the prior art snap connector does not constrain undesirable motion/movement between the coupled components. That is, nothing prevents snap connector 940 from proceeding further inward along the X axis within the mating component 960, and thereafter the snap connector 940 may proceed outward along the X axis within the mating component 960 until the latches 962 and 964 engage the barbed end 942. Furthermore, in such prior art snap connector implementation nothing prevents the snap connector 940 from moving out of the plane of the wafer (i.e., along the Z axis of FIGS. 9A and 9B), thereby permitting the components 970 and 980 to become uncoupled. Thus, the prior art snap connector only enables 2-D assembly in which components are coupled only in two dimensions, and does not provide a connector suitable for general assembly, which may include use for performing 3-D assembly. The prior art connector requires the translator positioning component 970 relative to component 980 to exert the force required to extend cantilever springs 960 and 966. These, as well as other characteristics of the prior art 2-D snap connectors make such prior art snap connectors unsuitable for general (or "all-purpose") assembly using low or near-zero insertion force translators.

Also, "snap locks" have been proposed for use in assembling a hollow triangular beam (see e.g., *Surfaced-Micromachined Components for Articulated MicroRobots*, by Richard Yeh, Ezekiel J. J. Kruglick, and Kristofer S. J. Pister, Journal of MicroElectroMechanical Systems, Vol. 5, No. 1, March 1996). Such a prior art snap lock proposal is shown in FIGS. 10A and 10B. As shown in FIG. 10A, a microcomponent is provided, which includes plates 10, 12, and 14. Plates 10 and 12 are rotatably coupled with a scissor hinge 16, and plates 12 and 14 are also coupled with a scissor hinge 18. Plate 10 includes snap locks 20, which may couple into mating apertures 22 of plate 14. Thus, the 13 hollow triangular beam of FIG. 10B may be formed by rotating plate 10 and 14 upward and coupling plates 10 and 14 with snap locks 20 and mating apertures 22. Accordingly, a 3-D object is formed by assembling the three-plated microcomponent together.

However, the prior art does not teach that such snap locks are suitable for general assembly. Rather, the snap locks are used together to enable a MEMs component to assemble itself to form a hollow triangular beam, but the prior art does not teach how such snap locks may be utilized for general assembly in coupling two separate components together. Additionally, it appears that such snap lock of the prior art may lack many characteristics that may be desired for a general coupling mechanism. For example, such snap lock does not allow for coupling a component normal to the wafer surface, but instead three hinged plates are disclosed such that two plates may be coupled at approximately 60 degrees to the wafer surface. Thus, the coupled plates 10 and 14 assist in maintaining the coupling by "leaning" on each other. No teaching suggests that the snap lock disclosed may be used for a general assembly operation that does not permit such "leaning," such as two microcomponents being coupled normal to each other. The pointed end 20 of the snap locks must deform during assembly. The force required for deformation needs to be provided to all 'arrowheads' simultaneously, making this a high-insertion force connector. As a result, the prior art teaching does not disclose a snap connector suitable for general assembly of microcomponents using near-zero insertion force, but rather provides only specific purpose mechanisms for assembling one particular type of MEMs component.

SUMMARY OF THE INVENTION

In view of the above, a desire exists for a coupling mechanism suitable for the assembly of microcomponents. A particular desire exists for a coupling mechanism that is suitable for performing general assembly of microcomponents, including 3-D assembly. A further desire exists for a coupling mechanism that enables microcomponents to be securely coupled to each other in a manner that constrains undesirable movement of the coupled components relative to each other.

These and other objects, features and technical advantages are achieved by a system and method which provide a general-purpose connector suitable for coupling microcomponents. More specifically, a snap connector is disclosed that is suitable for performing general assembly, including out-of-plane, 3-D assembly of microcomponents, wherein such microcomponents may be securely coupled together. That is, connectors are disclosed which enable microcomponents to be coupled in a manner that constrains undesirable movement of the coupled components relative to each other. Preferably, the connectors enable assembly operations utilizing a near-zero insertion force translator. For example, in one embodiment a sufficient force is provided by a relatively high force gripper to compress or "preload" engaging members (e.g., "arms") of a connector to a desired position for engaging another component, wherein such engagement can be performed by a relatively small or near-zero force translator.

A preferred embodiment provides a "preloaded" snap connector that may be utilized to perform general assembly of microcomponents. An alternative embodiment provides a non-preloaded snap connector suitable for performing general assembly of microcomponents. Still a further alternative embodiment provides a "squeeze" snap connector that is suitable for performing general assembly of microcomponents. Such connectors may be implemented as an integrated part of a microcomponent, or they may be implemented as separate, stand-alone correctors. For example, a dual-ended snap connector is disclosed herein, which may be coupled to a first microcomponent, and then used to couple the first microcomponent to a second microcomponent.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which:

FIGS. 9A and 9B show a prior art snap connector used for in-plane coupling of microcomponents; and FIGS. 10A and 10B show a prior art microcomponent that comprises three hinged plates and snap locks to enable the microcomponent to be assembled into a hollow triangular beam.

DETAILED DESCRIPTION

The present invention provides connectors suitable for coupling microcomponents, and it is intended to encompass various embodiments of such connectors. Most preferably, the connector is an integrated part of a microcomponent. For example, a microcomponent may be fabricated such that it includes one or more snap connectors to enable it to be coupled to a mating microcomponent. However, the snap connector may be a separate part (i.e., not integrated with the microcomponent) capable of being coupled to a microcomponent and enabling such microcomponent to then be coupled to a mating microcomponent, and any such implementation is intended to be within the scope of the present invention.

Figure 1A:
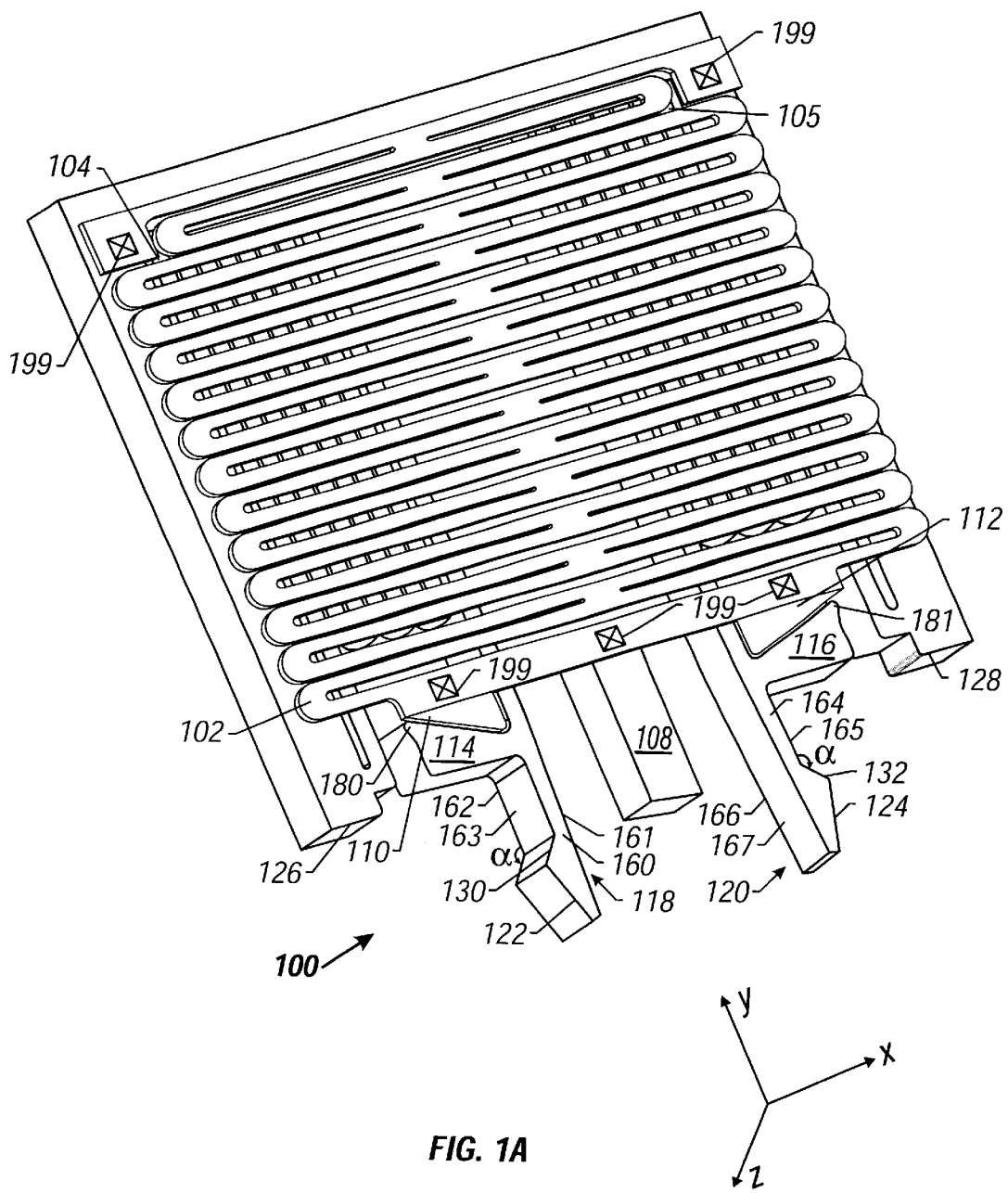
FIG. 1A shows an exemplary implementation of a single release preloaded snap connector of a preferred embodiment.
Figure 1B:
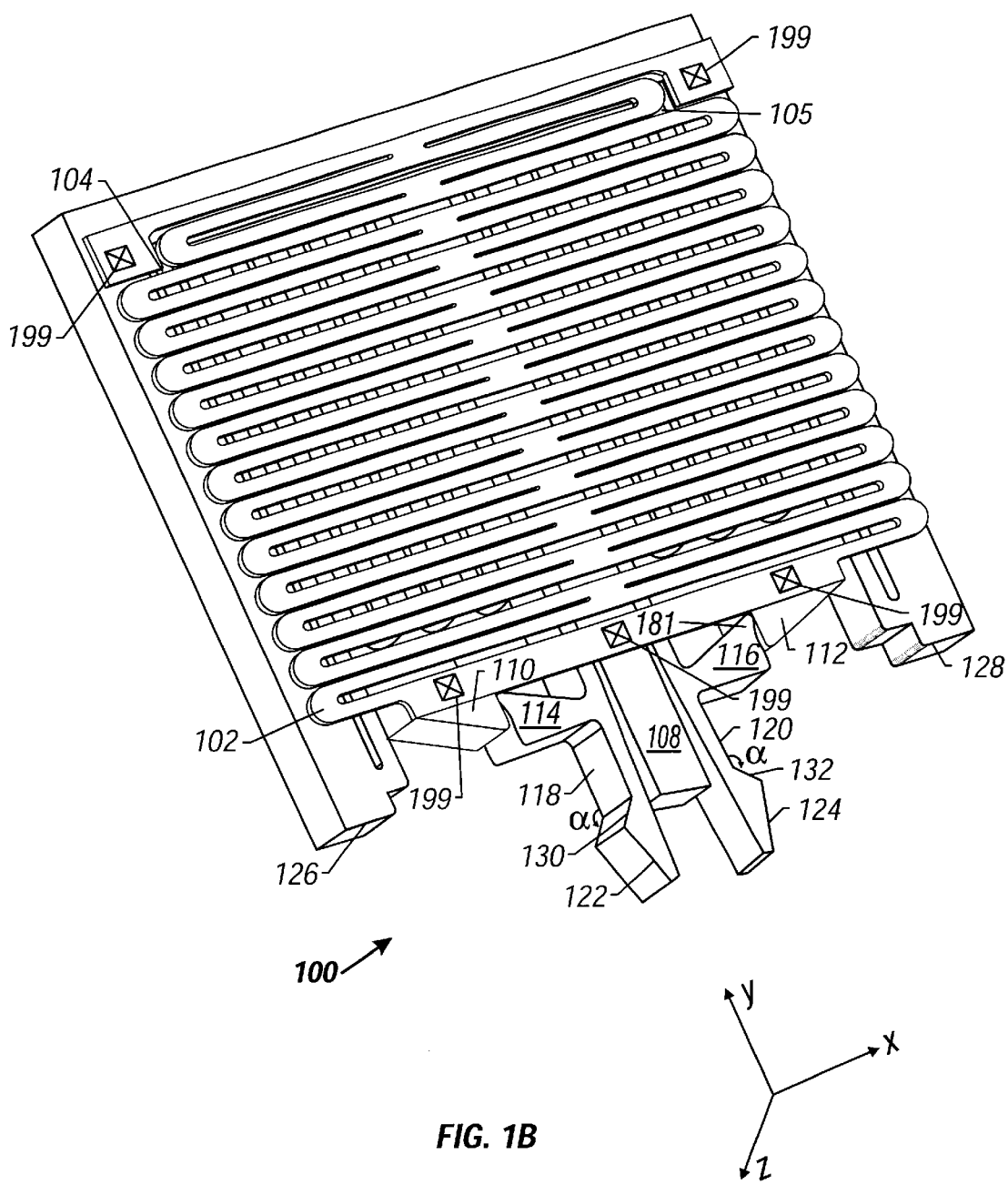
FIG. 1B shows an exemplary implementation of a single release preloaded snap connector of a preferred embodiment that is "preloaded;"

Turning to FIGS. 1A and 1B, an exemplary implementation of a "preloaded" snap connector of a preferred embodiment of the present invention is shown. More specifically, FIGS. 1A and 1B illustrate an exemplary single release preloaded snap connector 100. Such a single release preloaded snap connector basically comprises a spring latching mechanism that holds the snap connector's arms into position after they have been "loaded" or compressed. As shown in FIG. 1A, the single release preloaded snap connector 100 comprises three springs: 104, 105 and 102. Springs 104 and 105 are shown below the surface layer and act in the X direction of FIG. 1A, and spring 102 acts in the Y direction. As further shown in FIG. 1A, springs 104 and 105 form arms 118 and 120 of the snap connector 100. As an exemplary operation of coupling a microcomponent that includes the preloaded snap connector 100 to another microcomponent, one would use a relatively high-force gripper, such as tweezers, to grip arms 118 and 120 and compress them toward each other (i.e., along the X axis of FIG. 1A). As arms 118 and 120 are compressed, latching members 114 and 116 are moved inward to a point at which they are held in place by retaining members 110 and 112, as shown in FIG. 1B. At this point, the snap connector is said to be "preloaded." In a most preferred embodiment, such a relatively high force gripper may be capable of providing a compression force of approximately 500 microNewtons to approximately 5,000 microNewtons, for example. Further, in a most preferred embodiment, such preloaded snap connector 100 may require approximately 500 microNewton compression force, as an example, to be applied by such a gripper to preload such snap connector 100. The single release preloaded snap connector 100 also includes a single release mechanism (or "trigger") 108, which may be pressed upward in the Y direction of FIG. 1A to release the latching members 114 and 116 from the retaining members 110 and 112. In a most preferred embodiment, a force of approximately one hundred microNewtons may be applied to cause such a release from the retaining members, for example.

As illustrated in FIG. 1A, arms 118 and 120 include barbed ends which have "insertion sides" 122 and 124. As further shown, the barbed ends also include retention sides 130 and 132, which may be angled relative to their respective arms to aid in retaining the snap connector coupled to a mating component. That is, retention sides 130 and 132 may have an appropriate angle to maintain the snap connector fastened to the mating component in a desirable manner. For example, as shown in FIGS. 1A and 1B the retention sides 130 and 132 may be at an angle α to their respective arms 118 and 120, which may enable the snap connector 100 to securely "lock" into the mating component (i.e., not be easily disengaged from the mating component). However, in other implementations the angle α of retention sides 130 and 132 may vary in order to vary the "secureness" of the snap connector. For instance, a 90 degree angle α may be utilized to provide a permanent coupling, while other angles α may be implemented for retention sides 130 and 132 to enable a temporary/removable (or "disengageable") coupling.

Figure 2:
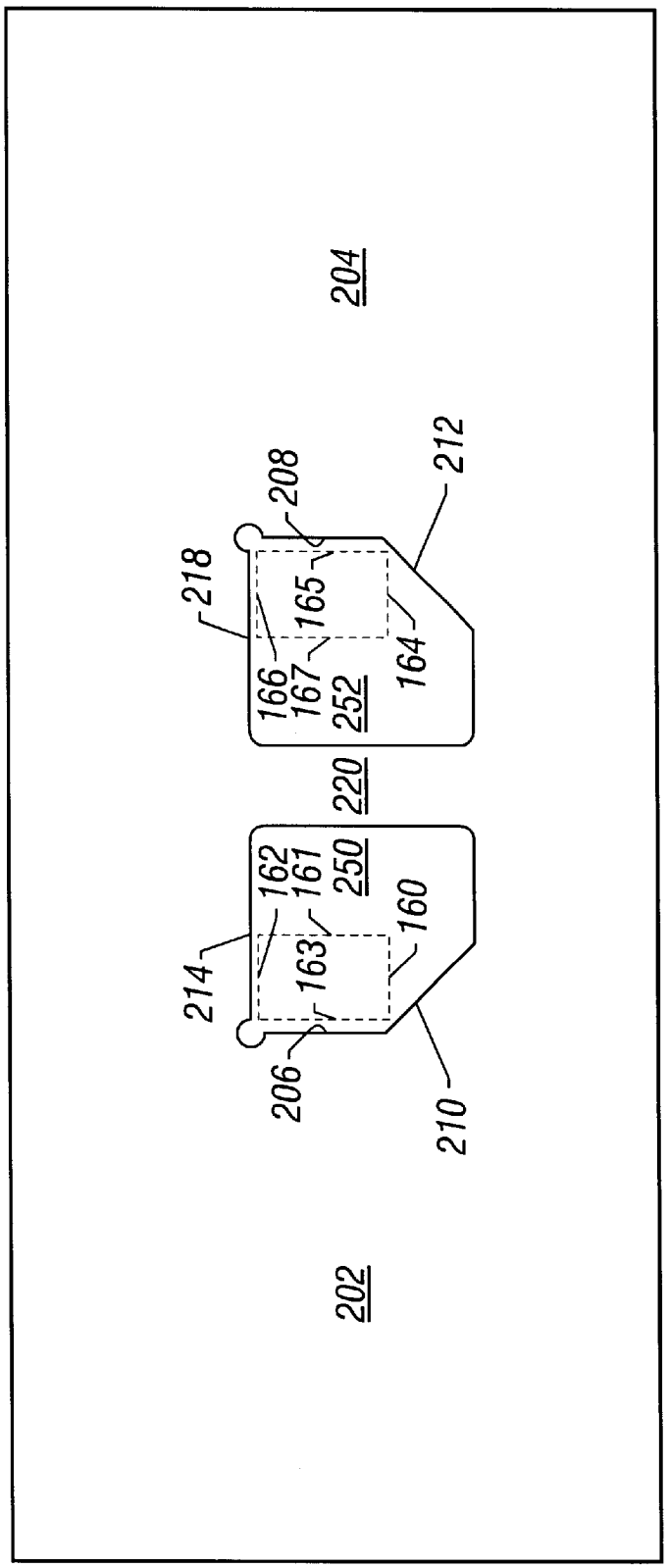
FIG. 2 shows an exemplary mating component that comprises apertures for receiving the single release preloaded snap connector of FIGS. 1A and 1B.

Most preferably, when the snap connector 100 is preloaded, the barbed ends of snap connector 100 are positioned to enable relatively easy insertion (e.g., requiring relatively little insertion force) of the barbed ends through apertures of a mating component (e.g., apertures 250 and 252 of mating component 200 in FIG. 2). Most preferably, insertion sides 122 and 124 of preloaded snap connector 100 do not contact the edges of a mating component's apertures during coupling. As a result, if the snap connector is properly aligned respective to a mating component, friction from contact of the snap connector's barbed ends with the edges of the mating component's apertures may be eliminated, thereby reducing the amount of insertion force required to couple the snap connector with the mating component. In a most preferred embodiment, an insertion force of approximately one hundred microNewtons, as an example, may be utilized to successfully couple the preloaded snap connector 100 with a mating component. As also shown in FIG. 1A, insertion sides 122 and 124 may be angled to aid in self-aligning of the snap connector with the mating component, assuming that the snap connector and mating component are misaligned when coupling.

Turning to FIG. 2, an exemplary mating component 200 having apertures 250 and 252 is shown. In operation, once the snap connector 100 is preloaded (as shown in FIG. 1B), the barbed ends of arms 118 and 120 are inserted through apertures 250 and 252 of mating component 200. As the barbed ends are inserted, release mechanism 108 engages (or "contacts") the "blocking surface" 220 of mating component 200, thereby releasing the latching mechanisms 114 and 116 from the retaining mechanisms 110 and 112. That is, as release mechanism 108 is forced upward (due to the insertion force being applied which causes the release mechanism 108 to engage the blocking surface 220), spring 102 compresses, thereby moving the retaining members 110 and 112 (which are coupled to spring 102) upward. Thus, when the spring 102 compresses such that retaining members 110 and 112 are moved upward to disengage latching members 114 and 116, latching members 114 and 116 return outward as springs 104 and 105 relax. That is, when latch members 114 and 116 disengage retaining members 110 and 112, springs 104 and 105 cause the arms 118 and 120 to return outward toward their "unloaded" position (i.e., the position of FIG. 1A), which is the biased position for the springs 104 and 105.

At that point, in a preferred embodiment, arm 118 applies a force toward side 206 of the mating component 200, and arm 120 applies a force toward side 208 of mating component 200. In a most preferred embodiment, arms 118 and 120 each apply a force of approximately one hundred fifty microNewtons to approximately two hundred microNewtons, as an example, toward sides 206 and 208, respectively. In a preferred embodiment, front side 160 of arm 118 engages angled side (or "wedge side") 210 of aperture 250, and back side 162 engages side 214 of aperture 250. Likewise, in a preferred embodiment, front side 164 of arm 120 engages angled side (or "wedge side") 212 of aperture 252, and back side 166 engages side 218 of aperture 252. As shown in phantom in FIG. 2, sides 163 and 161 of arm 118 and sides 165 and 167 of arm 120 may not actually engage (or contact) sides of apertures 250 and 252 in a preferred embodiment. However, in alternative embodiments, the snap connector's arms and/or the mating component's apertures may be implemented such that the sides of the arms do engage the sides of the apertures 250 and 252. For example, an implementation may be desirable in which engagement of the sides of the snap connector's arms and the sides of the apertures is desirable in that it provides an increased amount of surface area in contact, thereby increasing the amount of force required to disengage the snap connector from the mating component.

Additionally, the retaining surfaces 130 and 132 of the barbed ends engage the underside of mating component 200, and the "constrained surfaces" 126 and 128 of snap connector 100 come into contact with the "complementary surfaces" 202 and 204 of mating component 200. In the exemplary implementation of FIG. 1A, the retaining surfaces 130 and 132 apply a force against the underside of the mating component to aid in maintaining the snap connector having a secure connection (e.g., such that the constrained surfaces 126 and 128 are maintained flush against the complementary surfaces 202 and 204 of the mating component). As a result, the snap connector 100 works to securely couple its associated component to the mating component 200.

It should be recognized that such a snap connector 100 may be utilized for general assembly of microcomponents. That is, snap connector 100 is suitable not only for in-plane, 2-D assembly, but is also suitable for performing out-of-plane, 3-D assembly of microcomponents. When utilized for out-of-plane, 3-D assembly of microcomponents, the snap connector of a preferred embodiment can be utilized to restrict all three degrees of freedom between the coupled components. When utilized for in-plane, 2-D assembly, the snap connector may provide only a reduced restriction of the degrees of freedom between the coupled components (i.e., may restrict only two degrees of freedom). In a preferred embodiment, snap connector 100 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

As shown in the exemplary implementation of FIGS. 1A, 1B, and 2, the secure coupling provided between the snap connector 100 and the mating aperture may restrict all three degrees of linear freedom of the coupled components, respective to each other, as well as restricting rotational degrees of freedom with respect to each other. Accordingly, the snap connector 100 works to prevent the coupled components from moving linearly with respect to each other to prevent such coupled components from disengaging. More specifically, the snap connector works to prevent one of the coupled components from moving in either the X, Y, or Z directions of FIGS. 1A and 1B with respect to the other coupled component. More specifically, the snap connector 100 and the mating component's apertures (which may also be referred to as "receptacles") work together to prevent such movement in a preferred embodiment. That is, both components may together move in either the X, Y, or Z directions, but the snap connector and mating component apertures work to prevent only one of the coupled components from moving in such directions without the other component also moving in such directions. Furthermore, the snap connector and mating component apertures work to prevent the coupled components from rotating respective to each other. That is, both components may together rotate, but the snap connector, in combination with the mating component apertures, works to prevent only one of the coupled components from rotating without the other component also rotating in a like manner.

It should also be recognized that the snap connector's springs and barbed ends, as well as the aperture of the mating component, may be implemented to aid in allowing the snap connector to be self-positioning or self-centering with the mating component. For example, the inner walls 210, 212, 214, and 218 of apertures 250 and 252 of FIG. 2 are designed to receive the barbed ends of snap connector 100 (which have insertion sides 122 and 124 that may aid in self-aligning the snap connector 100 with the mating component). Additionally, springs 104 and 105 also aid in the self-aligning of the snap connector 100 by enabling the arms 118 and 120 some flexibility along the X axis of FIGS. 1A and 1B. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

Also, it should be recognized that the snap connector's springs may be fabricated in separate layers of the snap connector 100. For instance, springs 104 and 105, which operate in the X direction, may be in polysilicon layer 1 of the snap connector, and the spring 102, which operates in the Y direction, may be in polysilicon layer 2 (thus, overlaying springs 104 and 105). Various fabrication techniques may be utilized to achieve the springs in differing layers, including, as examples, those fabrication processes disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," U.S. Pat. No. 5,645,684 issued to Chris Keller entitled "MULTILAYER HIGH VERTICAL ASPECT RATIO THIN FILM STRUCTURES," as well as the fabrication process disclosed in concurrently filed and commonly assigned U.S. patent application Ser. No. 09/569, 328 entitled "METHOD AND SYSTEM FOR SELF-REPLICATING MANUFACTURING STATIONS." However, it should be recognized that the snap connector may be implemented with the snap connector's springs in the same layer, and any such implementation is intended to be within the scope of the present invention. As further shown in FIGS. 1A and 1B, anchors 199 are preferably implemented in the manner shown to anchor the polysilicon layer 2 to the polysilicon layer 1.

Furthermore, it should be recognized that only a very small insertion force may be required to couple the components using the preloaded snap connector 100. Basically, the insertion force must be just large enough to release the releasing mechanism 108. That is, the insertion force must be just great enough to overcome the spring 102 and the frictional force between the latching mechanisms 114 and 116 and their respective retaining mechanisms 110 and 112 to enable the releasing mechanism 108 to be moved along the Y axis as the snap connector 100 is coupled to the mating component. Most preferably, spring 102 is relatively weak, thereby reducing the amount of insertion force required to couple the snap connector 100 to a mating component 200. In fact, the frictional forces between the latching mechanisms 114 and 116 and their respective retaining mechanisms 110 and 112 maybe greater than the strength of spring 102, resulting in spring 102 being negligible in determining the amount of insertion force required for coupling. As shown in FIGS. 1A and 1B, latching mechanisms 114 and 116 preferably have a protruding portion (which may also be referred to as a "bulge" or "bump"), shown as 180 and 181 respectively. Such protruding portions 180 and 181 work to reduce the amount of surface area in contact between the latching mechanisms 114 and 116 and their respective retaining mechanisms 110 and 112 when the snap connector 100 is preloaded, thereby reducing the amount of friction and the amount of insertion force required for coupling. Thus, the insertion force required may be dependent on the strength of spring 102 and the frictional forces between the latching mechanisms 114 and 116 and their respective retaining mechanisms 110 and 112.

Figure 3A:
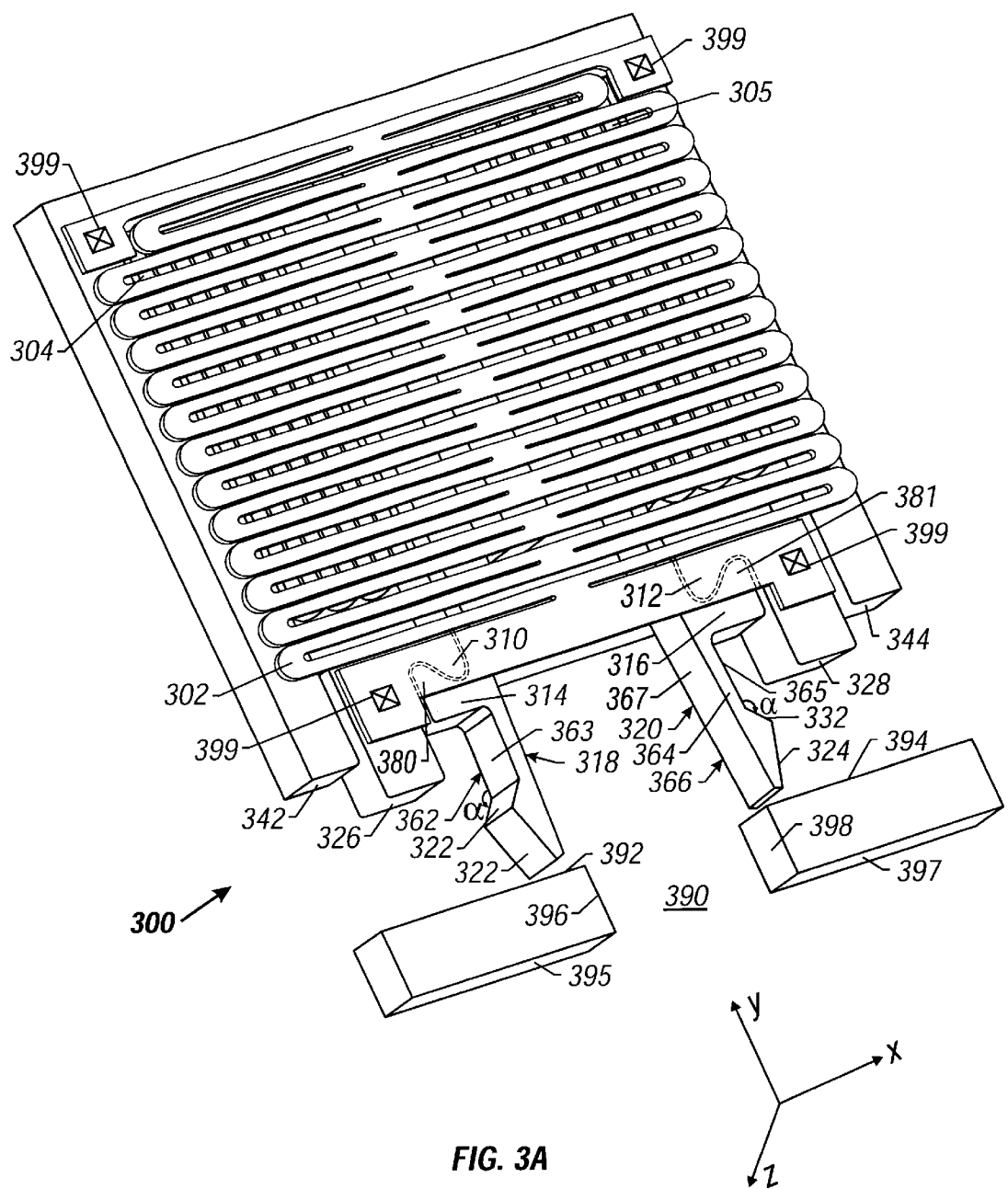
FIG. 3A shows an exemplary implementation of a dual release preloaded snap connector of a preferred embodiment.
Figure 3B:
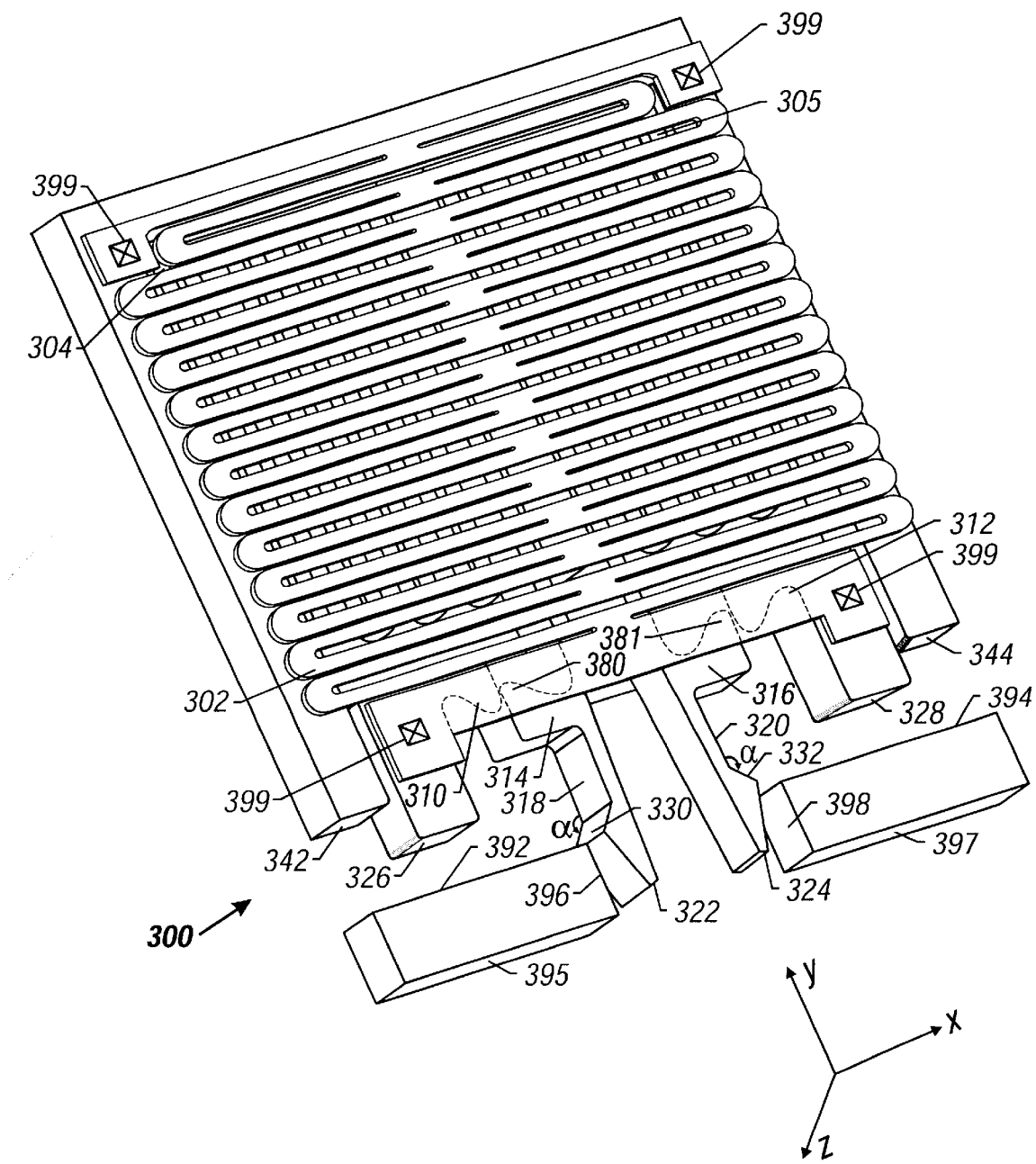
FIG. 3B shows an exemplary implementation of a dual release preloaded snap connector of a preferred embodiment that is "preloaded;"
Figure 4:
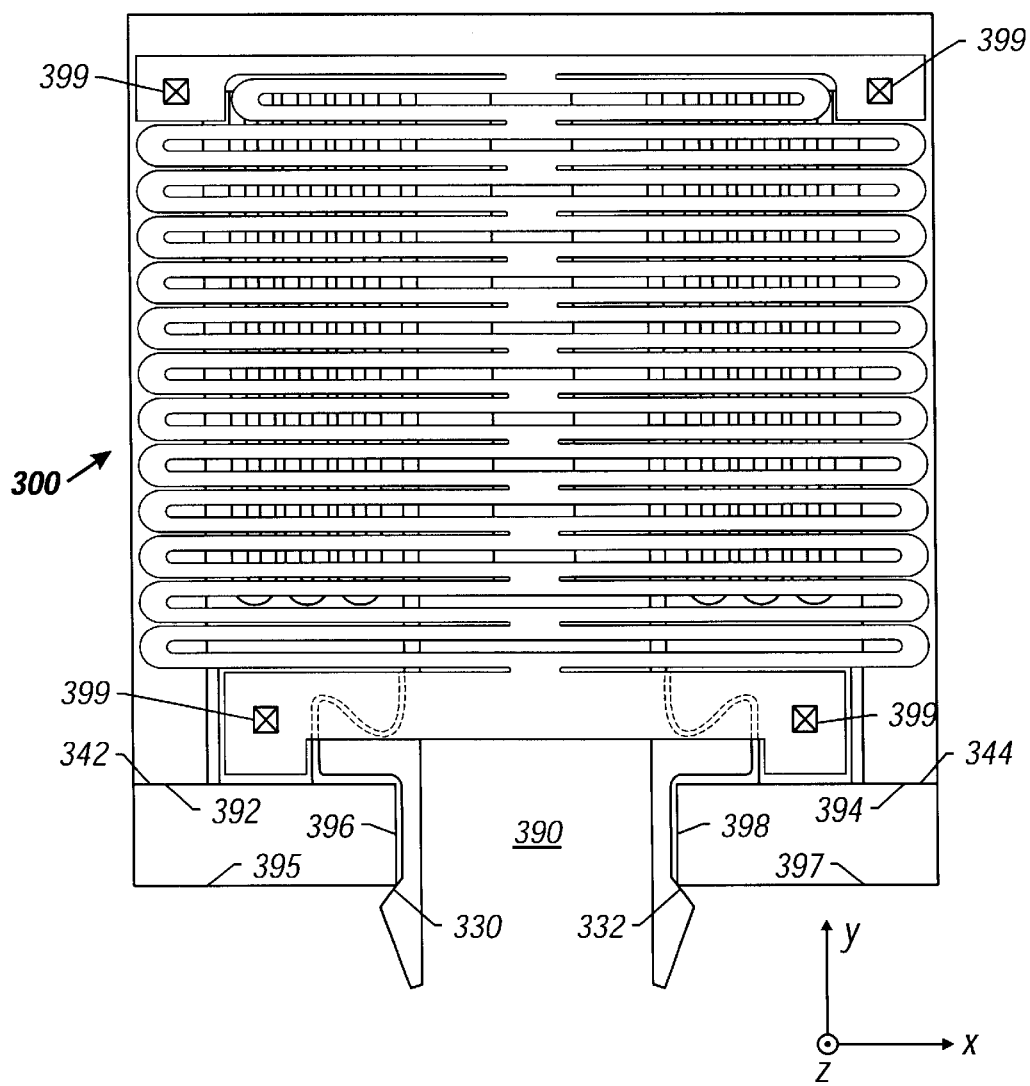
FIG. 4 shows the dual release preloaded snap connector of FIGS. 3A and 3B coupled to a mating component.

Turning now to FIGS. 3A–4, a further exemplary implementation of a preloaded snap connector of a preferred embodiment is illustrated. The exemplary implementation of FIGS. 3A–4 illustrates a dual release preloaded snap connector 300. The dual release preloaded snap connector 300 functions much like the single release preloaded snap connector 100 discussed above in conjunction with FIGS. 1A and 1B. However, rather than utilizing a single release mechanism (e.g., release mechanism 108 of FIGS. 1A and 1B), the preloaded snap connector 300 of FIGS. 3A–4 utilizes dual release mechanisms (or "dual triggers") 326 and 328. As an example of the operation of dual release preloaded snap connector 300, one may grip arms 318 and 320 and compress them toward each other (e.g., along the X axis of FIGS. 3A and 3B) causing latching members 314 and 316 to be moved to a point at which they are held in place by retaining members 310 and 312, as shown in FIG. 3B. Thus, the snap connector of FIG. 3B is referred to as being "preloaded." In a most preferred embodiment, such preloaded snap connector 300 may require approximately 500 microNewton compression force, as an example, to be applied by such a gripper to preload such snap connector 300. Such preloading may operate much the same as discussed above for FIGS. 1A and 1B. For instance, the snap connector 300 includes three springs, shown as springs 302, 304, and 305. Springs 304 and 305 act in the X direction of FIGS. 3A–4, and spring 302 acts in the Y direction of FIGS. 3A–4. Springs 302, 304, and 305 of snap connector 300 may operate much as described above for springs 102, 104, and 105 of snap connector 100 of FIGS. 1A and 1B. More specifically, spring 304 of snap connector 300 forms arm 318 and acts in the X direction of FIG.3A. Likewise, spring 305 of snap connector 300 forms arm 320 and acts in the X direction of FIG. 3A. Furthermore, spring 302 of snap connector 300 is coupled to dual release mechanisms 326 and 328 such that it acts in the Y direction of FIG. 3A.

As further shown in FIG. 3A, arms 318 and 320 include barbed ends which have "insertion sides" 322 and 324. As further shown, the barbed ends also include retention sides 330 and 332, which may be angled relative to their respective arms to aid in retaining the snap connector coupled to a mating component. That is, retention sides 330 and 332 may have an appropriate angle to maintain the snap connector fastened to the mating component in a desirable manner. For example, as shown in FIGS. 3A–4 the retention sides 130 and 132 may be at an angle $\alpha$ to their respective arms 318 and 320, which may enable the snap connector 300 be maintained coupled to the mating component. Depending on the coefficient of friction, the angle $\alpha$ that provides the desired amount of "secureness" of the snap connector varies, and any angle $\alpha$ being implemented within the snap connector is intended to be within the scope of the present invention. For instance, a 90 degree angle may be utilized to provide a permanent coupling, while other angles may be implemented for retention sides 330 and 332 to enable a temporary/removable (or "disengageable") coupling.

Most preferably, when the snap connector 300 is preloaded, the barbed ends of snap connector 300 are positioned to enable relatively easy insertion (e.g., requiring relatively little insertion force) of the barbed ends through aperture(s) of a mating component (e.g., aperture 390 of a mating component). Most preferably, insertion sides 322 and 324 of preloaded snap connector 300 do not contact the edges of a mating component's apertures during coupling. As a result, if the snap connector is properly aligned respective to a mating component, friction from contact of the snap connector's barbed ends with the edges of the mating component's apertures may be eliminated, thereby reducing the amount of insertion force required to couple the snap connector with the mating component. In a most preferred embodiment, an insertion force of approximately one hundred microNewtons, as an example, may be utilized to successfully couple the preloaded snap connector 300 with a mating component. As also shown in FIG. 3A, insertion sides 322 and 324 may be angled to aid in self-aligning of the snap connector with the mating component, assuming that the snap connector and mating component are misaligned when coupling.

As shown in FIG. 3B, the preloaded snap connector 300 may be coupled with a mating component by inserting the barbed ends of arms 318 and 320 through an aperture of such mating component. As further shown in FIG. 3B, as the arms 318 and 320 are inserted into an aperture of a mating component, dual release members 326 and 328 engage the surface 392 and 394 of the mating component causing the latching members 314 and 316 to disengage the retaining members 310 and 312. That is, as latching mechanisms 326 and 328 are forced upward (due to the insertion force being applied), spring 302 compresses, thereby moving the retaining members 310 and 312 (which are coupled to spring 102) upward. Thus, when the spring 302 compresses such that retaining members 310 and 312 are moved upward to disengage latching members 314 and 316, latching members 314 and 316 return outward as springs 304 and 305 relax. That is, as the latching members 314 and 316 disengage, arms 318 and 320 return outward toward their "unloaded" positions (along the X axis of FIGS. 3A–4), resulting in the snap connector 300 coupling its associated component with the mating component.

More specifically, in a preferred embodiment, arm 318 applies a force toward side 396 of the mating component, and arm 320 applies a force toward side 398 of the mating component. In a most preferred embodiment, arms 318 and 320 each apply a force of approximately one hundred fifty microNewtons to approximately two hundred microNewtons, as an example, toward sides 396 and 398, respectively. In a preferred embodiment, front side 360 of arm 318 engages an angled side (or wedge side) of the mating component's aperture 390 (not shown), and back side 362 of arm 318 engages the rear side of the component's aperture (not shown), in a manner similar to that shown and described above in conjunction with FIGS. 1A, 1B, and 2. Thus, as described above with the single-release preloaded snap connector 100, sides 363 and 361 of arm 318 and sides 365 and 367 of arm 320 may not actually engage (or contact) sides 396 and 398 of aperture 390 in a preferred embodiment. However, in alternative embodiments, the snap connector's arms and/or the mating component's aperture may be implemented such that the sides of the arms do engage the sides 396 and 398 of the aperture.

Additionally, the retaining surfaces 330 and 332 of the barbed ends engage the undersides of the mating component, respectively shown as 395 and 397 in FIGS. 3A–4, and constrained surfaces 342 and 344 of snap connector 300 engage the upper side of the mating component, shown as 392 and 394 in FIGS. 3A–4. In the exemplary implementation of FIGS. 3A–4, the retaining surfaces 330 and 332 apply a force against the undersides 395 and 397 of the mating component to aid in maintaining the snap connector having a secure connection (e.g., such that the constrained surfaces 342 and 344 are maintained flush against the complementary surfaces 392 and 394 of the mating component). As a result, the snap connector 300 works to securely couple its associated component to the mating component.

Turning to FIG. 4, an exemplary illustration of snap connector 300 coupled to a mating component is shown. As shown, retaining surfaces 330 and 332 engage the undersides 395 and 397 of the mating component, respectively, to maintain the snap connector coupled to the mating component. As further shown, in a preferred embodiment, the retaining surfaces 330 and 332 maintain sufficient force against the undersides 395 and 397 such that constrained surfaces 342 and 344 of snap connector 300 remain in flush contact against the complementary surfaces 392 and 394 of the mating component.

It should be recognized that such a snap connector 300 may be utilized for general assembly of microcomponents, just as discussed above for snap connector 100 of FIGS. 1A and 1B. That is, snap connector 300 is suitable not only for in-plane, 2-D assembly, but is also suitable for performing out-of-plane, 3-D assembly of microcomponents. When utilized for out-of-plane, 3-D assembly of microcomponents, the snap connector of a preferred embodiment can be utilized to restrict all three degrees of freedom between the coupled components. When utilized for in-plane, 2-D assembly, the snap connector may provide only a reduced restriction of the degrees of freedom between the coupled components (i.e., may restrict only two degrees of freedom). In a preferred embodiment, snap connector 300 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

As shown in the exemplary implementation of FIGS. 3A–4, the secure coupling provided between the snap connector 300 and the mating aperture may restrict all three degrees of linear freedom of the coupled components, respective to each other, as well as restricting rotational degrees of freedom with respect to each other. Accordingly, the snap connector 300 works to prevent the coupled components from moving linearly with respect to each other to prevent such coupled components from disengaging. More specifically, the snap connector works to prevent one of the coupled components from moving in either the X, Y, or Z directions of FIGS. 3A–4 with respect to the other coupled component. More specifically, the snap connector 300 and the mating component's aperture 390 (or "receptacle") work together to prevent such movement in a preferred embodiment. That is, both components may together move in either the X, Y, or Z directions, but the snap connector and mating component aperture work to prevent only one of the coupled components from moving in such directions without the other component also moving in such directions. Furthermore, the snap connector and mating component aperture work to prevent the coupled components from rotating respective to each other. That is, both components may together rotate, but the snap connector, in combination with the mating component aperture, works to prevent only one of the coupled components from rotating without the other component also rotating in a like manner.

It should also be recognized that the snap connector's springs and barbed ends, as well as the aperture of the mating component, may be implemented to aid in allowing the snap connector to be self-positioning or self-centering with the mating component. For example, the inner walls of the mating aperture may be designed to receive the barbed ends of snap connector 300 (which have insertion sides 322 and 324), and aids in self-aligning the snap connector 300 with a mating component. Additionally, springs 304 and 305 also aid in the self-aligning of the snap connector 300 by enabling the arms 318 and 320 some flexibility along the X axis of FIGS. 3A–4. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

It should also be recognized that just as described above for snap connector 100 of FIGS. 1A and 1B, the snap connector's springs maybe fabricated in separate layers of the snap connector 300. For instance, springs 304 and 305, which operate in the X direction, may be in polysilicon layer 1 of the snap connector, and the spring 302, which operates in the Y direction, may be in polysilicon layer 2 (thus, overlaying springs 304 and 305). As described above, various fabrication processes may be utilized to fabricate a snap connector having springs in different layers. However, it should be recognized that the snap connector 300 may be implemented with the snap connector's springs in the same layer, and any such implementation is intended to be within the scope of the present invention. As further shown in FIGS. 3A, 3B, and 4, anchors 399 are preferably implemented in the manner shown to anchor the polysilicon layer 2 to the polysilicon layer 1.

Furthermore, it should be recognized that only a very small insertion force may be required to couple the components using the preloaded snap connector 300. Basically, the insertion force must be just large enough to release the releasing mechanisms 326 and 328. That is, the insertion force must be just great enough to overcome the spring 302 and the frictional force between the latching mechanisms 314 and 316 and their respective retaining mechanisms 310 and 312 to enable the releasing mechanisms 326 and 328 to be moved along the Y axis as the snap connector 300 is coupled to the mating component. Most preferably, spring 302 is relatively weak, thereby reducing the amount of insertion force required to couple the snap connector 300 to a mating component. In fact, the frictional forces between the latching mechanisms 314 and 316 and their respective retaining mechanisms 310 and 312 may be greater than the strength of spring 302, resulting in spring 302 being negligible in determining the amount of insertion force required for coupling. As shown in FIGS. 3A–4, latching mechanisms 314 and 316 preferably have a protruding portion (which may also be referred to as a "bulge" or "bump"), shown as 380 and 381 respectively. Such protruding portions 380 and 381 work to reduce the amount of surface area in contact between the latching mechanisms 314 and 316 and their respective retaining mechanisms 310 and 312 when the snap connector 300 is preloaded, thereby reducing the amount of friction and the amount of insertion force required for coupling. Thus, the insertion force required may be dependent on the strength of spring 302 and the frictional forces between the latching mechanisms 314 and 316 and their respective retaining mechanisms 310 and 312.

In view of the exemplary implementations described above, it should be recognized that various other implementations of preloaded snap connectors are possible, and any such implementations are intended to be within the scope of the present invention. Thus, the present invention is not intended to be limited only to the implementations of a preloaded snap connector provided herein, rather such implementations are intended solely as examples that render the disclosure enabling for many other implementations of a preloaded snap connector. For example, the latching mechanism(s) and release mechanism(s) of a preloaded snap connector may be implemented in any number of ways within the snap connector, and any such implementation is intended to be within the scope of the present invention. For instance, the springs of the preloaded snap connectors disclosed above may be implemented within a common layer, rather than in separate layers, as described above.

Figure 5:
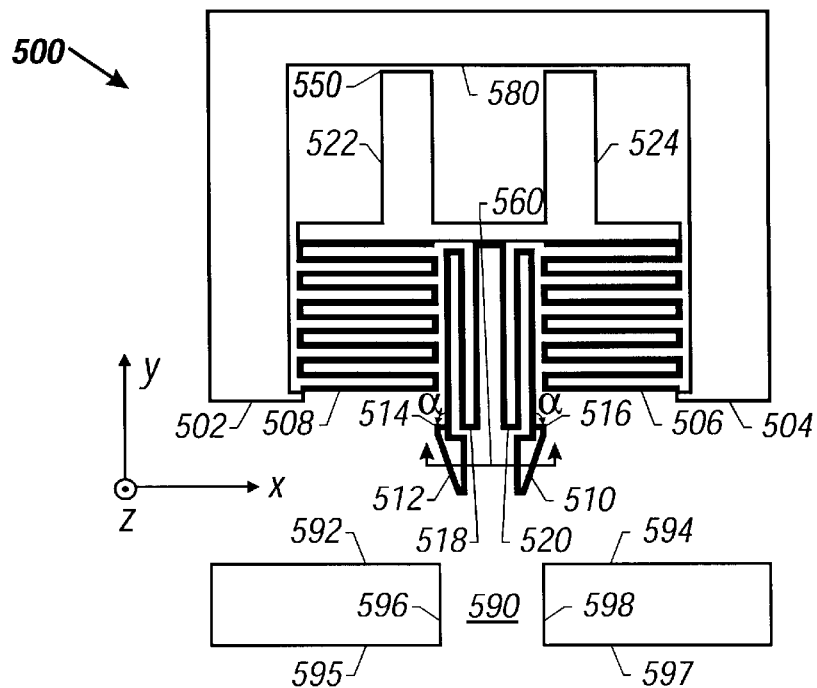
FIG. 5 shows a first exemplary implementation of a non-preloaded snap connector of an alternative embodiment.

As described above, a preferred embodiment utilizes preloaded snap connectors for coupling microcomponents. An alternative embodiment may be implemented utilizing nonpreloaded snap connectors to achieve such coupling. Various implementations of nonpreloaded snap connectors are possible. Turning to FIG. 5, a first exemplary implementation of a non-preloaded snap connector is shown. The exemplary snap connector of FIG. 5 comprises four springs, shown as 506, 508, 518, and 520. Springs 506 and 508 act in the Y direction of FIG. 5, and springs 518 and 520 act in the X direction of FIG. 5. Most preferably, the dimensions of springs 506 and 508 (i.e., the "Y-direction springs") are the same, and the dimensions of springs 518 and 520 (i.e., the "X-direction springs") are the same. The X-direction springs 518 and 520 each form an "arm," on which barbed ends are provided. The barbed ends include "insertion sides" 510 and 512. Insertion sides 510 and 512 may be angled to ease insertion of the barbed ends through an aperture of a mating component and/or to aid in self-aligning of the snap connector with the mating component. As further shown, the barbed ends also include retention sides 514 and 516, which may be angled relative to their respective arms to aid in retaining the snap connector coupled to a mating component. That is, retention sides 514 and 516 may have an appropriate angle α to maintain the snap connector fastened to the mating component in a desirable manner. For example, as shown in FIG. 5 the retention sides 514 and 516 may be at an angle α approximately 90 degrees to their respective "arms" 518 and 520, which may enable the snap connector 500 to securely "lock" into the mating component (i.e., not be easily disengaged from the mating component). However, in other implementations the angle α of retention sides 514 and 516 may vary in order to vary the "secureness" of the snap connector. For instance, the 90 degree angle α of FIG. 5 may be utilized to provide a permanent coupling, while other angles a may be implemented for retention sides 514 and 516 to enable a temporary/removable (or "disengageable") coupling.

As shown, in a preferred embodiment of snap connector 500, the Y-direction springs 506 and 508 are coupled to "separation members" 522 and 524. Separation members 522 and 524 are each separated from surface 580 of the snap connector some distance, shown as 550, when the Y-direction springs 506 and 508 are relaxed. Springs 506 and 508 of snap connector 500 work to maintain the "constrained surfaces" 502 and 504 of the snap connector flush against the surface 592 and 594 of the mated component.

As an example of the operation of the snap connector 500 of FIG. 5, one may utilize a gripper, such as tweezers, to grip the snap connector on separation members 522 and 524. The snap connector 500 is then moved such that the barbed ends of arms 518 and 520 are inserted through aperture(s) 590 of a mating component. In this embodiment, the width of the aperture 590 of a mating component (i.e., in the X-direction of FIG. 5) is smaller than the width 560 of the snap connector's barbed ends when the springs 518 and 520 are relaxed. Accordingly, as the barbed ends are inserted, the insertion sides 510 and 512 engage (or "contact") the edges 596 and 598 of the aperture 590. If sufficient insertion force is provided, the spring arms 518 and 520 will compress toward each other (i.e., along the X axis of FIG. 5), thereby allowing the barbed ends to be inserted through aperture 590 of the mating component. In a most preferred embodiment, an insertion force of approximately three hundred microNewtons to approximately five hundred microNewtons, as an example, may be utilized to successfully couple the snap connector 500 with a mating component. Thus, the insertion force required for the exemplary implementation of FIG. 5 may be significantly greater than that required for the preloaded snap connector embodiments disclosed above, as well as the squeeze connector embodiments disclosed hereafter. In a preferred embodiment, the snap connector 500 is designed with the intent that a user grip the snap connector at the separation members 522 and 524 when inserting the snap connector through aperture 590 of the mating component. Otherwise, if not gripped at separation members 522 and 524 during insertion, the separation members 522 and 524 may be pushed upward until contacting the surface 580.

Once the barbed ends have been inserted through the aperture 590, the compression force on the spring arms 518 and 520 is no longer present. Accordingly, the spring arms 518 and 520 will release outward away from each other and come into contact with the sides (or "edges") 596 and 598 of aperture 590 of the mating component. In a most preferred embodiment, arms 518 and 520 each apply a force of approximately two hundred microNewtons, as an example, toward sides 596 and 598, respectively. Furthermore, the retention sides 514 and 516 of the barbed ends engage the underside of the mating component, shown as 595 and 597, and the constrained surfaces 502 and 504 of snap connector 500 engage the upper side of the mating component, shown as 592 and 594. In the exemplary implementation of FIG. 5, springs 506 and 508 provide a force in the Y direction to aid in maintaining the snap connector having a secure connection and in maintaining the constrained surfaces 502 and 504 flush against the upper side of the mating component's surface. As a result, the snap connector 500 works to securely couple its associated component to the mating component.

It should be recognized that such a snap connector 500 may be utilized for general assembly of microcomponents, just as described above for the preloaded snap connector embodiment. That is, snap connector 500 is suitable not only for in-plane, 2-D assembly, but is also suitable for performing out-of-plane, 3-D assembly of microcomponents. When utilized for out-of-plane, 3-D assembly of microcomponents, a preferred embodiment of snap connector 500 utilized in conjunction with a receptacle, such as that described in FIG. 2, can be utilized to restrict all three degrees of freedom between the coupled components. When utilized for in-plane, 2-D assembly, the snap connector 500 may provide only a reduced restriction of the degrees of freedom between the coupled components (i.e., may restrict only two degrees of freedom ). A preferred embodiment of snap connector 500 enables out-of plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

As shown in the exemplary implementation of FIG. 5, the secure coupling provided between the snap connector 500 and the mating aperture may restrict all three degrees of linear freedom of the coupled components, respective to each other, as well as restricting rotational degrees of freedom with respect to each other. Accordingly, the snap connector 500 works to prevent the coupled components from moving linearly with respect to each other to prevent such coupled components from disengaging. More specifically, the snap connector works to prevent one of the coupled components from moving in either the X, Y, or Z directions of FIG. 5 with respect to the other coupled component. More specifically, the snap connector 500 and the mating component's aperture(s) work together to prevent such movement in a preferred embodiment. That is, both components may together move in either the X, Y, or Z directions, but the snap connector and mating component aperture(s) work to prevent only one of the coupled components from moving in such directions without the other component also moving in such directions. Furthermore, the snap connector and mating component aperture(s) work to prevent the coupled components from rotating respective to each other. That is, both components may together rotate, but the snap connector, in combination with the mating component aperture(s), works to prevent only one of the coupled components from rotating without the other component also rotating in a like manner.

It should also be recognized that the snap connector's springs and barbed ends, as well as the aperture of the mating component, may be implemented to aid in allowing the snap connector to be self-positioning or self-centering with the mating component. For example, the inner walls of the mating aperture may be designed to receive the barbed ends of snap connector 500 (which have insertion sides 510 and 512), and aids in self-aligning the snap connector 500 with a mating component. Additionally, springs 518 and 520 also aid in the self-aligning of the snap connector 500 by enabling the arms formed thereby some flexibility along the X axis of FIG. 5. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

It should also be recognized that just as described above for the preloaded snap connector embodiment, the snap connector's springs may be fabricated in separate layers of the snap connector 500. For instance, springs 518 and 520, which operate in the X direction, may be in polysilicon layer 1 of the snap connector, and springs 506 and 508, which operate in the Y direction, may be in polysilicon layer 2. As described above, various fabrication processes may be utilized to fabricate a snap connector having springs in different layers. However, it should be recognized that the snap connector 500 may be implemented with the snap connector's springs in the same layer, and any such implementation is intended to be within the scope of the present invention. Furthermore, it should be recognized that a relatively small insertion force may be required to couple the components using the snap connector 500. Basically, the insertion force must be large enough to compress the spring arms 518 and 520 sufficient to enable the barbed ends to be inserted through the aperture of the mating component. Thus, the insertion force required is dependent on the strength of springs 518 and 520. Furthermore, as shown in FIG. 5, the insertion sides 510 and 512 may be angled in a manner that minimizes the amount of surface area in contact during the insertion. That is, the insertion sides may be angled to minimize the amount of surface area between the inner walls of the mating aperture and the barbed ends of the snap connector that are in contact during insertion, thereby reducing the amount of insertion force required.

Figure 6A:
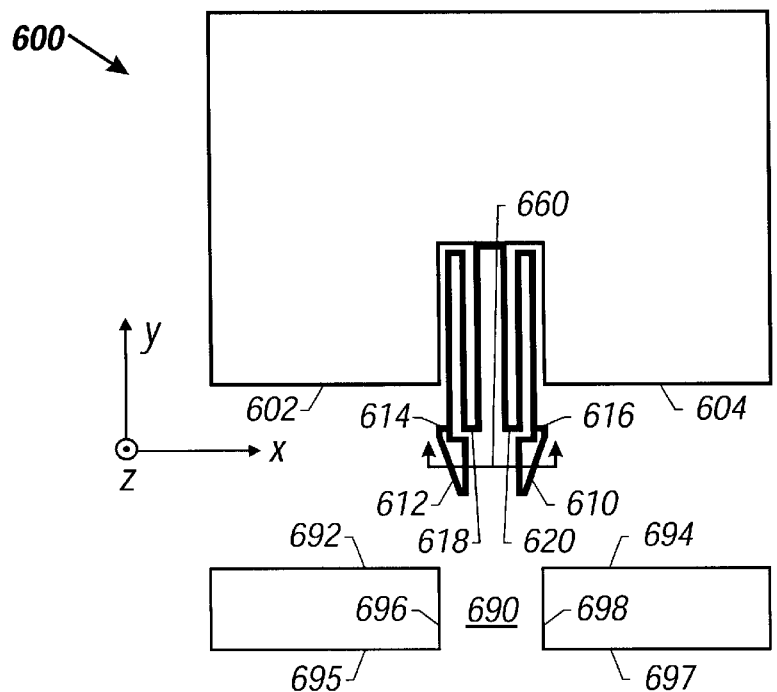
FIG. 6A shows a second exemplary implementation of a non-preloaded snap connector of an alternative embodiment.

Turning to FIG. 6A, another exemplary implementation of a non-preloaded snap connector is shown. The exemplary snap connector of FIG. 6A comprises two springs, shown as 618 and 620. Springs 618 and 620 act in the X direction of FIG. 6A. In a most preferred embodiment, the dimensions of springs 618 and 620 (i.e., the "X-direction springs") are the same. The X-direction springs 618 and 620 each form an "arm," on which barbed ends are provided. The barbed ends include "insertion sides" 610 and 612. Insertion sides 610 and 612 may be angled to ease insertion of the barbed ends through an aperture of a mating component and/or to aid in self-aligning of the snap connector with the mating component. As further shown, the barbed ends also include retention sides 614 and 616, which may be angled relative to their respective arms to aid in retaining the snap connector coupled to a mating component. That is, retention sides 614 and 616 may have an appropriate angle to maintain the snap connector fastened to the mating component in a desirable manner. For example, the retention sides 614 and 614 may be at an angle α to their respective arms 618 and 620, which may enable the snap connector 600 to be maintained coupled to the mating component. Depending on the coefficient of friction, the angle α that provides the desired amount of "secureness" of the snap connector varies, and any angle a being implemented within the snap connector is intended to be within the scope of the present invention. For instance, the 90 degree angle of FIGS. 1A and 1B may be utilized to provide a permanent coupling, while other angles may be implemented for retention sides 614 and 616 to enable a temporary/removable (or "disengageable") coupling.

As an example of the operation of the snap connector 600 of FIG. 6A, one may utilize a gripper, such as tweezers, to grip the snap connector or its associated component in some manner. The snap connector 600 is then moved such that the barbed ends of arms 618 and 620 are inserted through aperture(s) 690 of a mating component. In this embodiment, the width of the aperture 690 of a mating component (i.e., in the X-direction of FIG. 6A) is smaller than the width 660 of the snap connector's barbed ends when the springs 618 and 620 are relaxed. Accordingly, as the barbed ends are inserted, the insertion sides 610 and 612 engage (or "contact") the edges 696 and 698 of the aperture 690. If sufficient insertion force is provided, the spring arms 618 and 620 will compress toward each other (i.e., along the X axis of FIG. 6A), thereby allowing the barbed ends to be inserted through aperture 690 of the mating component. In a most preferred embodiment, an insertion force of approximately three hundred microNewtons to approximately five hundred microNewtons, as an example, may be utilized to successfully couple the snap connector 600 with a mating component.

Once the barbed ends have been inserted through the aperture 690, the compression force on the spring arms 618 and 620 is no longer present. Accordingly, the spring arms 618 and 620 will release outward away from each other and apply a force toward the sides (or "edges") 696 and 698 of aperture 690 of the mating component. In a most preferred embodiment, arms 618 and 620 each apply a force of approximately two hundred microNewtons, as an example, toward sides 696 and 698, respectively. Furthermore, the retention sides 614 and 616 of the barbed ends engage the underside of the mating component, shown as 695 and 697, and the constrained surfaces 602 and 604 of snap connector 600 engage the upper side of the mating component, shown as 692 and 694. As a result, the snap connector 600 works to securely couple its associated component to the mating component.

It should be recognized that such a snap connector 600 may be utilized for general assembly of microcomponents, just as described above for the preloaded snap connector embodiment. That is, snap connector 600 is suitable not only for in-plane, 2-D assembly, but is also suitable for performing out-of-plane, 3-D assembly of microcomponents. When utilized for out-of-plane, 3-D assembly of microcomponents, a preferred embodiment of the snap connector 600 can be utilized to restrict all three degrees of freedom between the coupled components. When utilized for in-plane, 2-D assembly, the snap connector 600 may provide only a reduced restriction of the degrees of freedom between the coupled components (i.e., may restrict only two degrees of freedom). A preferred embodiment of snap connector 600 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

As shown in the exemplary implementation of FIG. 6A, the secure coupling provided between the snap connector 600 and the mating aperture may restrict all three degrees of linear freedom of the coupled components, respective to each other, as well as restricting rotational degrees of freedom with respect to each other. Accordingly, the snap connector 600 works to prevent the coupled components from moving linearly with respect to each other to prevent such coupled components from disengaging. More specifically, the snap connector works to prevent one of the coupled components from moving in either the X, Y, or Z directions of FIG. 6A with respect to the other coupled component. More specifically, the snap connector 600 and the mating component's aperture(s) work together to prevent such movement in a preferred embodiment. That is, both components may together move in either the X, Y, or Z directions, but the snap connector and mating component aperture(s) work to prevent only one of the coupled components from moving in such directions without the other component also moving in such directions. Furthermore, the snap connector and mating component aperture(s) work to prevent the coupled components from rotating respective to each other. That is, both components may together rotate, but the snap connector, in combination with the mating component's aperture(s), works to prevent only one of the coupled components from rotating without the other component also rotating in a like manner.

It should also be recognized that the snap connector's springs and barbed ends, as well as the aperture of the mating component, may be implemented to aid in allowing the snap connector to be self-positioning or self-centering with the mating component. For example, the inner walls of the mating aperture may be designed to receive the barbed ends of snap connector 600 (which have insertion sides 610 and 612), and aids in self-aligning the snap connector 600 with a mating component. Additionally, springs 618 and 620 also aid in the self-aligning of the snap connector 600 by enabling the arms formed thereby some flexibility along the X axis of FIG. 6A. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

Figure 6B:
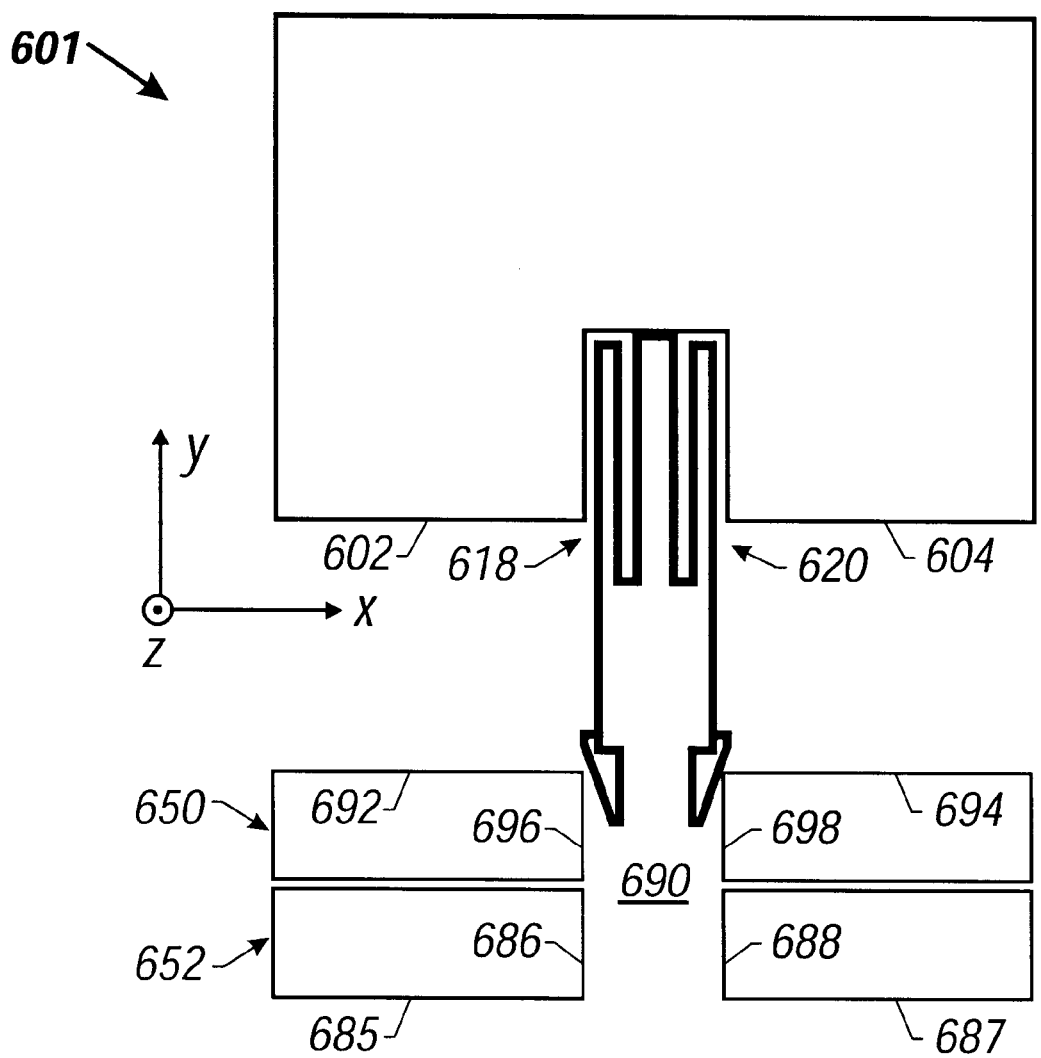
FIG. 6B shows the non-preloaded snap connector of FIG. 6A having extended arms to allow for two or more stacked mating components to be simultaneously coupled.

A further exemplary implementation of the snap connector of FIG. 6A is illustrated in FIG. 6B, as snap connector 601. As shown in FIG. 6B, arms 618 and 620 may be implemented having an extended length sufficient to enable such arms to simultaneously couple two or more stacked mating components, such as stacked mating components 650 and 652. As an example of the operation of the snap connector 601 of FIG. 6B, one may utilize a gripper, such as tweezers, to grip the snap connector or its associated component in some manner. The snap connector 601 is then moved such that the barbed ends of extended arms 618 and 620 are inserted through aperture(s) 690 of the stacked mating components 650 and 652. In this embodiment, the width of the aperture 690 of the stacked mating components (i.e., in the X-direction of FIG. 6B) is smaller than the width of the snap connector's barbed ends when the springs 618 and 620 are relaxed. Accordingly, as the barbed ends are inserted, the insertion sides engage (or "contact") the edges 696, 698, 686 and 688 of the aperture 690. If sufficient insertion force is provided, the spring arms 618 and 620 will compress toward each other (i.e., along the X axis of FIG. 6B), thereby allowing the barbed ends to be inserted through aperture 690 of the mating components.

Once the barbed ends have been inserted through the aperture 690, the compression force on the spring arms 618 and 620 is no longer present. Accordingly, the spring arms 618 and 620 will release outward away from each other and apply a force toward the sides (or "edges") 696, 698, 686, and 688 of aperture 690 of the mating components. Furthermore, the retention sides 614 and 616 of the barbed ends engage the underside of the bottom stacked mating component 652, shown as 685 and 687, and the constrained surfaces 602 and 604 of snap connector 601 engage the upper side of the top stacked mating component 650, shown as 692 and 694. As a result, the snap connector 601 works to securely couple its associated component to the stacked mating components 650 and 652. Of course, it should be realized that any number of stacked mating components may be simultaneously coupled in a similar manner if the arms 618 and 620 of snap connector 601 are implemented having sufficient length.

Figure 7A:
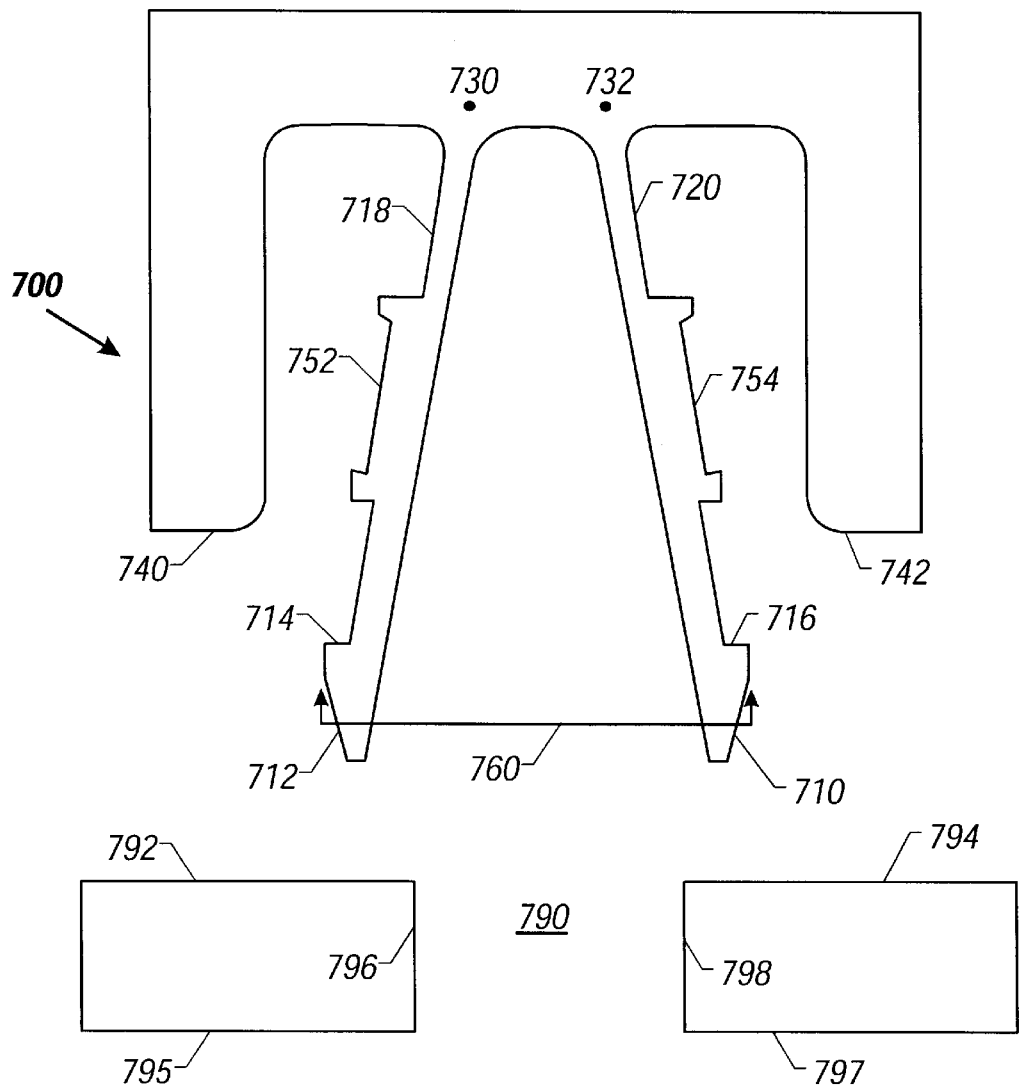
FIG. 7A shows a first exemplary implementation of a "squeeze connector" of a further alternative embodiment.

Turning now to FIG. 7A, an example of a further alternative embodiment of a connector that may be implemented to achieve coupling of two components is shown. The alternative embodiment of FIG. 7A may be referred to herein as a "squeeze" connector (or a squeeze snap connector). Such a squeeze connector may be utilized to couple components in a manner that requires near-zero insertion force to be exerted. The exemplary squeeze connector 700 of FIG. 7A comprises two springs, shown as 718, and 720. Springs 718 and 720 may act in both the X and the Y directions of FIG. 7A. In a most preferred embodiment, the dimensions of springs 718 and 720 are the same. The springs 718 and 720 each form an "arm," on which barbed ends are provided. The barbed ends include "insertion sides" 710 and 712. As further shown, the barbed ends include retention sides 714 and 716, which may be angled to maintain a desired coupling. For example, the barbed ends may be angled such that they are when engaged with a mating component they are parallel to sides 740 and 742.

As an example of the operation of the squeeze connector of FIG. 7A, one may utilize a gripper, such as tweezers, to grip the squeeze connector 700. In the exemplary implementation of FIG. 7A, a "handle" (or "ridge"), shown as 752 and 754, is provided on the arms of the squeeze connector, which is designed to enable a gripper to grip the arms of the connector and maintain its position on the arms while coupling the squeeze connector to a mating component. When a compression force is applied to the arms, the arms rotate approximately about points 730 and 732 allowing the ends to translate in both the X and Y directions. In a most preferred embodiment, a compression force of approximately one thousand microNewtons, as an example, may be applied to compress the arms toward each other. The squeeze connector is then moved such that the barbed ends of arms 718 and 720 are inserted through aperture(s) 790 of a mating component. In this embodiment, the width of the aperture 790 of a mating component (i.e., in the X-direction of FIG. 7A) is smaller than the width 760 of the connector's barbed ends when the springs 718 and 720 are relaxed. The gripper may be utilized to squeeze the arms 718 and 720 toward each other to a position at which the barbed ends may be inserted through an aperture 790 of a mating component without contact therebetween. That is, in a preferred implementation of connector 700, the arms 718 and 720 may be squeezed together to a point at which no contact is made between the barbed ends of the arms and the edges of a mating component's aperture 790, thereby reducing the amount of insertion force required to couple the components to near-zero.

Once the barbed ends have been inserted through the aperture 790, the gripper may then release the arms 718 and 720, at which time the compression force on the spring arms 718 and 720 is no longer present. Accordingly, the spring arms 718 and 720 will release outward away from each other and apply a force toward the sides (or "edges") 796 and 798 of aperture 790 of the mating component. In a most preferred embodiment, arms 718 and 720 each apply a force of approximately five hundred microNewtons, as an example, toward sides 796 and 798, respectively. Furthermore, upon release by the gripper, the retention sides 714 and 716 of the barbed ends move upward (i.e., along the Y axis of FIG. 7A) and engage the underside of the mating component, shown as 795 and 797. In a preferred implementation of squeeze connector 700, the retention sides 714 and 716 present a force against the underside 795 and 797 of the mating component in a manner that aids in maintaining the surfaces 740 and 742 of the associated component in flush contact with sides 792 and 794 of the mating component. As a result, the connector 700 works to securely couple its associated component to the mating component.

In view of the above, the squeeze connector 700 may be coupled to a mating component with a near-zero insertion force being required. Because the connector's arms 718 and 720 may be initially squeezed toward each other, the barbed ends of the connector 700 may be inserted through a mating component's aperture 790 with no contact therebetween.

In a preferred implementation, the squeeze connector 700 may be disengaged by basically repeating the steps utilized for coupling the connector 700 to a mating component. That is, a gripper may be utilized to grip the arms of the squeeze connector (e.g., by gripping handles 752 and 754). The gripper may apply a force to squeeze the arms 718 and 720 toward each other. Once the arms 718 and 720 have been sufficiently squeezed toward each other causing the retention sides 714 and 716 to disengage and move downward, the barbed ends may be extracted through aperture(s) 790 of the mating component, thereby disengaging the connector from the mating component. In a preferred implementation, the arms 718 and 720 of connector 700 may be sufficiently squeezed toward each other such that the barbed ends may be disengaged from the mating component without contact being made between the barbed ends of the arms and the edges of the mating component's aperture 790, thereby reducing the amount of extraction force required to de-couple the components. In a most preferred implementation, connector 700 may then be reused to couple its associated component with another mating component. As a result, squeeze connector 700 provides a disengageable and/or reusable connector.

It should be recognized that such a squeeze connector 700 may be utilized for general assembly of microcomponents, just as described above for the preloaded snap connector embodiment. That is, connector 700 is suitable not only for in-plane, 2-D assembly, but is also suitable for performing out-of-plane, 3-D assembly of microcomponents. When utilized for out-of-plane, 3-D assembly of microcomponents, a preferred implementation of connector 700 can be utilized to restrict all three degrees of freedom between the coupled components. When utilized for in-plane, 2-D assembly, squeeze connector 700 may provide only a reduced restriction of the degrees of freedom between the coupled components (i.e., may restrict only two degrees of freedom). A preferred implementation of squeeze connector 700 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

As shown in the exemplary implementation of FIG. 7A, the secure coupling provided between connector 700 and the mating aperture may restrict all three degrees of linear freedom of the coupled components, respective to each other, as well as restricting rotational degrees of freedom with respect to each other. Accordingly, squeeze connector 700 works to prevent the coupled components from moving linearly with respect to each other to prevent such coupled components from disengaging. More specifically, the squeeze connector works to prevent one of the coupled components from moving in either the X, Y, or Z directions of FIG. 7A with respect to the other coupled component. More specifically, connector 700 and mating component aperture(s) work together to prevent such movement in a preferred implementation. That is, both components may together move in either the X, Y, or Z directions, but the squeeze connector and mating component aperture(s) work to prevent only one of the coupled components from moving in such directions without the other component also moving in such directions. Furthermore, the connector and mating component aperture(s) work to prevent the coupled components from rotating respective to each other. That is, both components may together rotate, but the squeeze connector, in combination with the mating component aperture(s), works to prevent only one of the coupled components from rotating without the other component also rotating in a like manner.

It should also be recognized that the squeeze connector's springs and barbed ends, as well as the aperture of the mating component, may be implemented to aid in allowing the connector to be self-positioning or self-centering with the mating component. For example, the inner walls of the mating aperture may be designed to receive the barbed ends of connector 700, and aids in self-aligning connector 700 with a mating component. Additionally, springs 718 and 720 also aid in the self-aligning of squeeze connector 700 by enabling the arms formed thereby some flexibility along the X axis of FIG. 7A. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

Figure 7B:
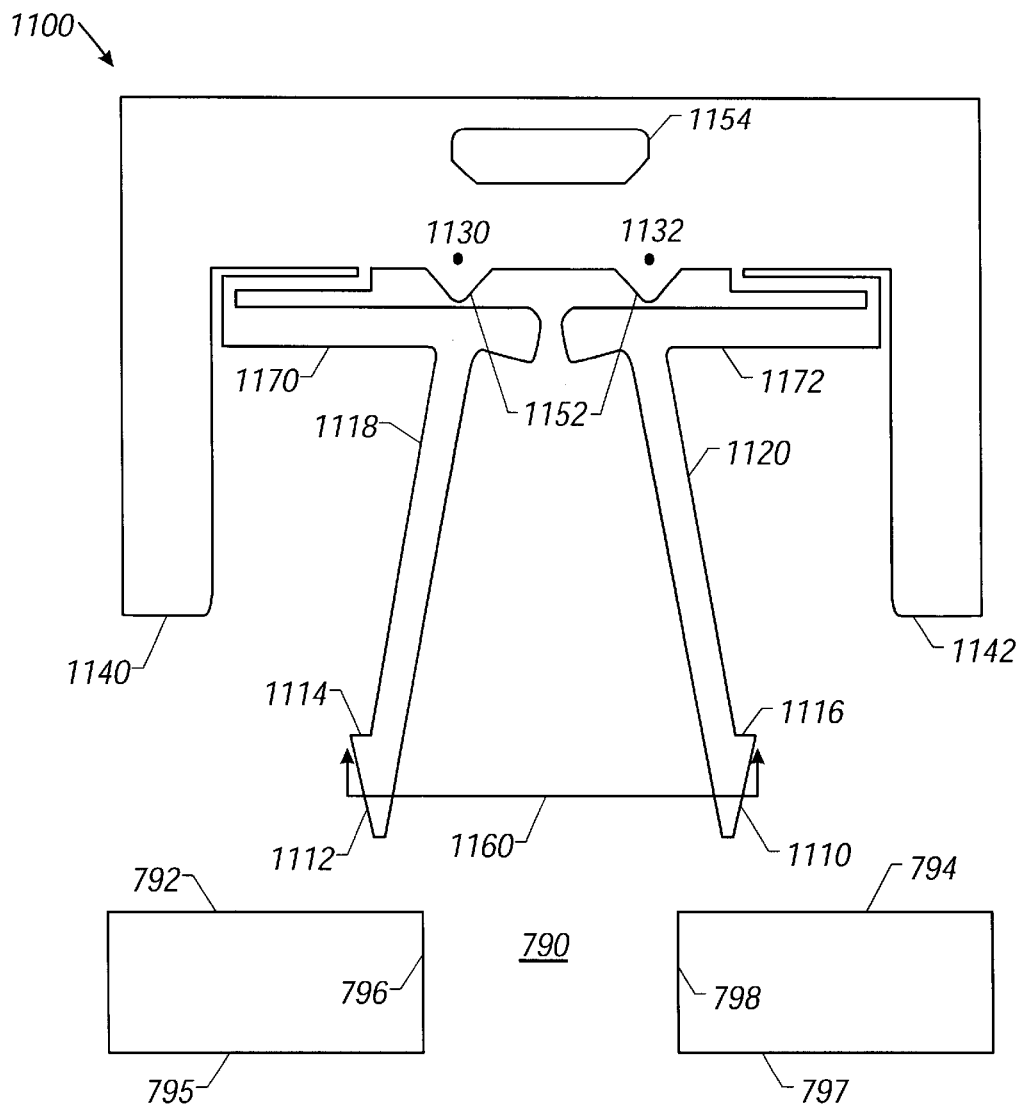
FIG. 7B shows a second exemplary implementation of a "squeeze connector" of a further alternative embodiment.

Turning now to FIG. 7B, an example of a further alternative embodiment of a connector that may be implemented to achieve coupling of two components is shown. FIG. 7B shows a squeeze connector 1100 similar to squeeze connector 700 of FIG. 7A, wherein the gripper force applied to squeeze connector 1100 is perpendicular to the motion of its arms. Such a squeeze connector may be utilized to couple components in a manner that requires near-zero insertion force to be exerted. The exemplary squeeze connector 1100 of FIG. 7B comprises two springs, shown as 1170, and 1172. In a most preferred embodiment, the dimensions of springs 1170 and 1172 are the same. Also shown are arms 1118 and 1120 on which barbed ends 1110 and 1112 are included, which are moveable in both the X and the Y directions of FIG. 7B. As further shown, the barbed ends include retention sides 1114 and 1116, which may be angled to maintain a desired coupling. For example, the barbed ends may be angled such that they are when engaged with a mating component they are parallel to sides 1140 and 1142.

As an example of the operation of the squeeze connector of FIG. 7B, one may utilize a gripper, such as tweezers, to grip the squeeze connector 1100. In the exemplary implementation of FIG. 7B, a "handle," shown as 1152 and 1154, is further provided to enable a gripper to apply a compression force thereto to extend springs 1170 and 1172 in order to effectively squeeze the arms 1118 and 11120 toward each other. Thus, a compression force may be applied approximately perpendicular to the motion of the arms compressing. When a compression force is applied to the handle 1152 and 1154, the arms rotate approximately about points 1130 and 1132 allowing the ends to translate in both the X and Y directions. In a most preferred embodiment, a compression force of approximately one thousand microNewtons, as an example, may be applied to the handle in order to compress the arms toward each other. The squeeze connector is then moved such that the barbed ends of arms 1118 and 1120 are inserted through aperture(s) 790 of a mating component. In this embodiment, the width of the aperture 790 of a mating component (i.e., in the X-direction of FIG. 7B) is smaller than the width 1160 of the connector's barbed ends when the springs 1118 and 1120 are relaxed. The gripper may be utilized to squeeze the handle 1152 and 1154 to compress arms 1118 and 1120 toward each other to a position at which the barbed ends may be inserted through an aperture 790 of a mating component without contact therebetween. That is, in a preferred implementation of connector 1100, the handle 1152 and 1154 may be squeezed toward each other to position the arms to a point at which no contact is made between the barbed ends of the arms and the edges of a mating component's aperture 790, thereby reducing the amount of insertion force required to couple the components to near-zero.

Once the barbed ends have been inserted through the aperture 790, the gripper may then release the handle 1152 and 1154, at which time the extension force on the springs 1170 and 1172 is no longer present. Accordingly, the arms 1118 and 1120 will release outward away from each other and apply a force toward the sides (or "edges") 796 and 798 of aperture 790 of the mating component. In a most preferred embodiment, arms 1118 and 1120 each apply a force of approximately five hundred microNewtons, as an example, toward sides 796 and 798, respectively. Furthermore, upon release by the gripper, the retention sides 1114 and 1116 of the barbed ends move upward (i.e., along the Y axis of FIG. 7B) and engage the underside of the mating component, shown as 795 and 797. In a preferred implementation of squeeze connector 1100, the retention sides 1114 and 1116 present a force against the underside 795 and 797 of the mating component in a manner that aids in maintaining the surfaces 1140 and 1142 of the associated component in flush contact with sides 792 and 794 of the mating component. As a result, the connector 1100 works to securely couple its associated component to the mating component.

In view of the above, the squeeze connector 1100 may be coupled to a mating component with a near-zero insertion force being required. Because the connector's arms 1118 and 1120 may be initially moved toward each other, the barbed ends of the connector 1100 may be inserted through a mating component's aperture 790 with no contact therebetween.

In a preferred implementation, the squeeze connector 1100 may be disengaged by basically repeating the steps utilized for coupling the connector 1100 to a mating component. That is, a gripper may be utilized to move the arms of the squeeze connector (e.g., by gripping handles 1152 and 1154). Once the arms 1118 and 1120 have been sufficiently moved toward each other causing the retention sides 1114 and 1116 to disengage and move downward, the barbed ends may be extracted through aperture(s) 790 of the mating component, thereby disengaging the connector from the mating component. In a preferred implementation, the arms 1118 and 1120 of connector 1100 may be sufficiently moved toward each other such that the barbed ends may be disengaged from the mating component without contact being made between the barbed ends of the arms and the edges of the mating component's aperture 790, thereby reducing the amount of extraction force required to decouple the components. In a most preferred implementation, connector 1100 may then be reused to couple its associated component with another mating component. As a result, squeeze connector 1100 provides a disengageable and/or reusable connector.

It should be recognized that such a squeeze connector 1100 may be utilized for general assembly of microcomponents, just as described above for the preloaded snap connector embodiment. That is, connector 1100 is suitable not only for in-plane, 2-D assembly, but is also suitable for performing out-of-plane, 3-D assembly of microcomponents. When utilized for out-of-plane, 3-D assembly of microcomponents, a preferred implementation of connector 1100 can be utilized to restrict all three degrees of freedom between the coupled components. When utilized for in-plane, 2-D assembly, squeeze connector 1100 may provide only a reduced restriction of the degrees of freedom between the coupled components (i.e., may restrict only two degrees of freedom). A preferred implementation of squeeze connector 1100 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

As shown in the exemplary implementation of FIG. 7B, the secure coupling provided between connector 1100 and the mating aperture may restrict all three degrees of linear freedom of the coupled components, respective to each other, as well as restricting rotational degrees of freedom with respect to each other. Accordingly, squeeze connector 1100 works to prevent the coupled components from moving linearly with respect to each other to prevent such coupled components from disengaging. More specifically, the squeeze connector works to prevent one of the coupled components from moving in either the X, Y, or Z directions of FIG. 7B with respect to the other coupled component. More specifically, connector 1100 and mating component aperture(s) work together to prevent such movement in a preferred implementation. That is, both components may together move in either the X, Y, or Z directions, but the squeeze connector and mating component aperture(s) work to prevent only one of the coupled components from moving in such directions without the other component also moving in such directions. Furthermore, the connector and mating component aperture(s) work to prevent the coupled components from rotating respective to each other. That is, both components may together rotate, but the squeeze connector, in combination with the mating component aperture(s), works to prevent only one of the coupled components from rotating without the other component also rotating in a like manner.

It should also be recognized that the squeeze connector's springs and barbed ends, as well as the aperture of the mating component, may be implemented to aid in allowing the connector to be self-positioning or self-centering with the mating component. For example, the inner walls of the mating aperture may be designed to receive the barbed ends of connector 1100, and aids in self-aligning connector 1100 with a mating component. Additionally, springs 1170 and 1172 also aid in the self-aligning of squeeze connector 1100 by enabling the arms formed thereby some flexibility along the X axis of FIG. 7B. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

Figure 8:
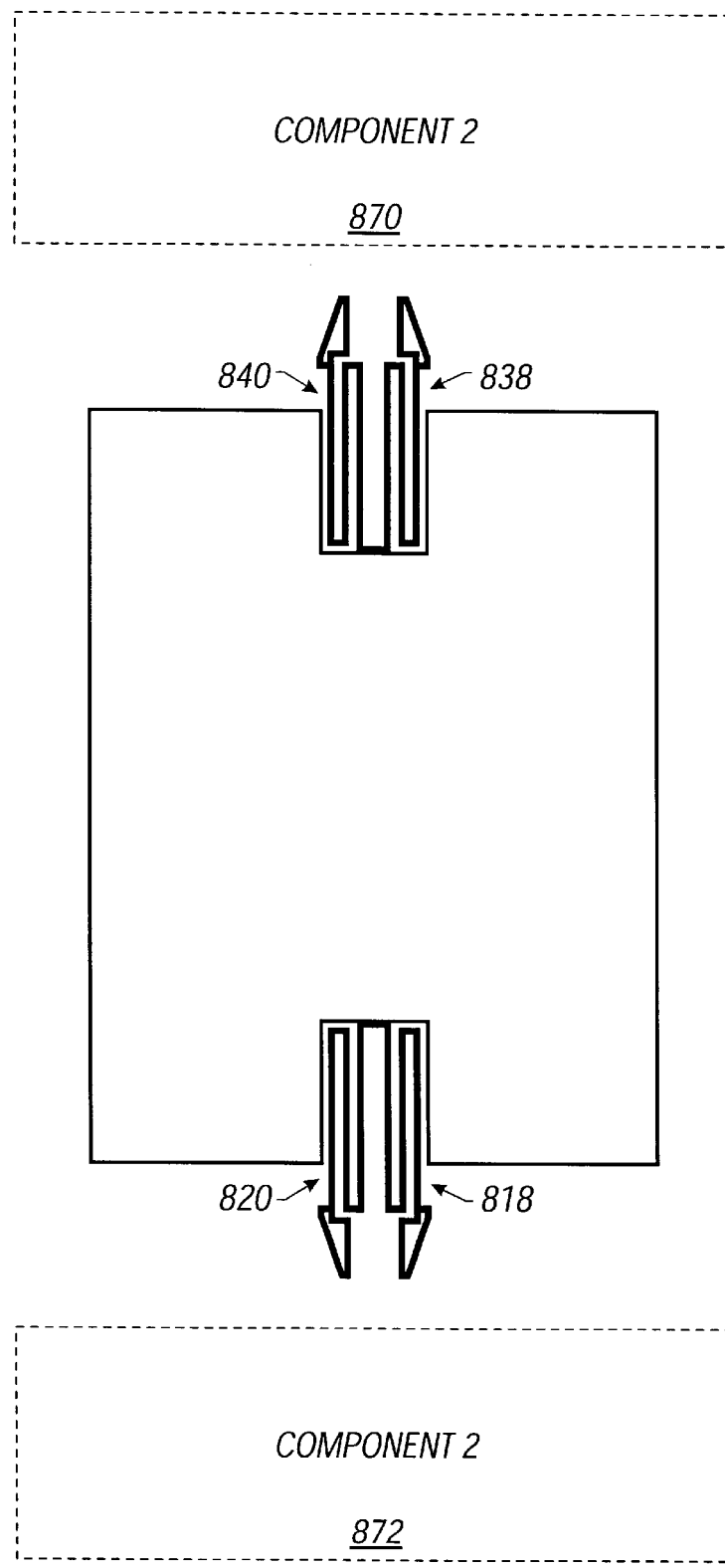
FIG. 8 shows an exemplary implementation of a dual snap connector.

Most preferably, the connector embodiments described above are an integrated part of their associated microcomponents. For example, a microcomponent may be fabricated such that it includes one or more of such connector embodiments to enable it to be coupled to a mating microcomponent. However, the snap connector embodiments may instead be implemented as a separate part (i.e., not integrated with the microcomponent) that is capable of being coupled to a microcomponent and enabling such microcomponent to then be coupled to a mating microcomponent. For example, tuning to FIG. 8, an exemplary dual ended snap connector 800 is provided. In the exemplary implementation of FIG. 8, the dual ended snap connector 800 includes a first snap connector implementation as described above in conjunction with FIG. 6A on one end of the snap connector 800, and includes a second snap connector implementation as described above in conjunction with FIG. 6A on the opposite end of the snap connector 800. More specifically, the snap connector 800 has a snap connector on a first end that comprises arms 818 and 820 formed by X-direction springs. On the opposite end, snap connector 800 provides a snap connector that comprises arms 838 and 840 formed by X-direction springs. Thus, the snap connector 800 may first be coupled to a first component 870, which may be referred to as an "associated component," and may then be coupled to a second component 872, which may be referred to as a "mating component," thereby coupling the first and second components.

It should be recognized that any type of connector may be implemented on each end such a dual ended connector 800, and a different type of connector may be implemented on each end. Moreover, it should be recognized that the connectors need not be implemented on opposite ends of connector 800, but rather may be implemented on any side of connector 800. Also, more than two connectors may be implemented within connector 800. For example, additional connectors may be implemented on sides 882 and 884 of connector 800.

It should be understood that the connectors of the present invention may include further enhancements, which are intended to be within the scope of the present invention. For example, such connectors may include conductive traces (e.g., gold) therein, in a manner that enables the connectors to provide electrical couplings between mated components. An example of such an electrical connector is further disclosed in concurrently filed and commonly assigned U.S. patent application Ser. No. 09/569,328 entitled "RIBBON CABLE AND ELECTRICAL CONNECTOR FOR USE WITH MICROCOMPONENTS," the disclosure of which is hereby incorporated herein by reference. As another example, such connectors may have arms of any length. For instance, the arms may be sufficiently long to enable a connector to simultaneously couple two or more components, such as shown in the exemplary implementation of FIG. 6B.

It should be understood that the actual coupling of microcomponents may be performed in any manner now known or later developed, including but not limited to the microcomponents being coupled by a user, by a robotic assembly mechanism, or by any other type of assembly mechanism, and any such method of coupling is intended to be within the scope of the present invention. It should also be understood that, as described above, the connector and mating aperture may be designed to enable the microcomponents to be self-aligning in order to ease the coupling operation. Examples of self-alignment designs have been provided in some of the implementations provided above (e.g., the preloaded snap connector of FIGS. 1A and 1B, as well as the complementary mating apertures of FIG. 2). However, it should be understood that the present invention is not intended to be limited only to the self-alignment designs provided herein, rather such designs are intended solely as examples that render the disclosure enabling for many other types of self-alignment designs. Accordingly, any self-alignment design for a connector and its mating aperture now known or later developed is intended to be within the scope of the present invention.

It should be recognized that the embodiments disclosed herein for connectors may may be implemented for small-scale connectors. For example, the connectors of the various embodiments disclosed herein may have a size of approximately one hundred microns by one hundred microns, as an example. Accordingly, such connectors may have a surface area of approximately ten thousand square microns, as an example, and a volume of approximately one hundred thousand cubic microns, as an example. Of course, various implementations of snap connectors having any size that is smaller or larger than such exemplary sizes are intended to be within the scope of the present invention.

It should be recognized that the embodiments disclosed herein enable a "pressure fit" to be achieved between a connector and a mating component. For example, springs that are biased in a manner to cause a snap connector's arms to apply a force against a mating component's apertures enables the snap connector to be pressure fit with a mating component (e.g., apply a force against the mating component). Of course, such a pressure fit between the snap connector and mating component may be achieved in any manner now known or later developed. Thus, the present invention is not intended to be limited solely to achieving a pressure fit between a connector and a mating component by utilizing springs within the connector, but rather any type of pressure fitting implementation is intended to be within the scope of the present invention.

While various exemplary implementations have been provided herein in which a connector comprises two arms with barbed ends for coupling to a mating component, it should be understood that the present invention is not intended to be limited only to the two-arm connector implementations provided herein, but rather such implementations provided herein are intended solely as examples that render the disclosure enabling for many other types of connector implementations. Accordingly, any number of arms having barbed ends may be implemented for a connector, and any such implementation is intended to be within the scope of the present invention. Also, while various exemplary implementations have been provided herein for mating apertures that may be utilized for mating a component with a connector, it should be understood that the present invention is not intended to be limited only to the mating aperture designs provided herein, but rather such designs provided herein are intended solely as examples that render the disclosure enabling for many other types of mating apertures that may be utilized for receiving a connector. Accordingly, any type of mating aperture now known or later developed may be implemented for receiving a connector, and any such design is intended to be within the scope of the present invention.

Furthermore, while a handle has been shown and described herein for the squeeze connector of FIG. 7, it should be understood that any of the connectors of the present invention may be implemented with such a handle to aid a gripping mechanism in handling the connector. Moreover, while exemplary angles of the retention sides of the barbed ends of a connector have been shown and described herein, it should be understood that the present invention is not intended to be limited only to the angles of the retention sides provided herein, but rather such implementations provided herein are intended solely as examples that render the disclosure enabling for many other types of connector implementations having various other retention side angles. For example, various retention side angles may be utilized depending on the secureness of the coupling that is desired. For instance, certain angles may be utilized to provide a more permanent coupling between the components, while other angles may be implemented to provide a more temporary coupling. It should also be understood that the X-direction of the FIGS. shown herein may be referred to as a "horizontal" or "lateral" direction with respect to the mating component. It should also be understood that the Y-direction of the FIGS. shown herein may be referred to as a "vertical" direction with respect to the mating component.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A connector for coupling at least two microcomponents, comprising:
   at least one engagement member for engaging a receptacle of at least a first microcomponent;
   said at least one engagement member implemented to enable said at least one engagement member to be pressure fit with said receptacle; and
   at least one latch mechanism for latching said at least one engagement member to a position for a desired coupling of said at least a first microcomponent;
   wherein said connector is capable of engaging said at least a first microcomponent in a manner that constrains translational freedom of said at least a first microcomponent relative to said connector in three dimensions and wherein said constraint of translational freedom is not solely frictional in any of said three dimensions.

2. The connector of claim 1 wherein said connector has a size less than approximately two hundred microns by two hundred microns.

3. The connector of claim 1 wherein said connector is capable of engaging said at least a first microcomponent in a manner that further constrains rotational freedom of said at least a first microcomponent relative to said connector.

4. The connector of claim 1 further comprising:
   at least one handle for aiding in positioning a gripper as said gripper applies a force against said at least one engagement member.

5. The connector of claim 1 wherein said at least one engagement member includes a barbed end.

6. The connector of claim 5 wherein said barbed end includes a retaining surface for engaging the underside of said receptacle when said connector is coupled with said at least a first microcomponent.

7. The connector of claim 1 further comprising:
   at least one constraining surface that is maintained flush against the upperside of said at least a first microcomponent when said connector is coupled with said at least a first microcomponent.

8. The connector of claim 1 wherein said position for a desired coupling is a position that enables said at least one engagement member to penetrate said receptacle without contacting the edges of said receptacle.

9. The connector of claim 1 wherein said position for a desired coupling is a position that enables said at least one engagement member to penetrate said receptacle with a minimal insertion force applied.

10. The connector of claim 9 wherein said insertion force is a near-zero insertion force.

11. The connector of claim 1 further comprising:
    at least one release mechanism for releasing said at least one engagement member to enable said at least one engagement member to couple said connector with said at least a first microcomponent.

12. The connector of claim 11 wherein said at least one release mechanism is arranged to release said at least one engagement member as said at least one engagement member penetrates said receptacle of said at least a first microcomponent.

13. The connector of claim 12 wherein upon said release mechanism releasing said at least one engagement member, said at least one engagement member applies a force against said receptacle.

14. The connector of claim 13 further comprising two of said release mechanisms.

15. An apparatus for performing general assembly of two or more microcomponents, said apparatus comprising:
    at least one engagement member for penetrating a receptacle of at least a first microcomponent to couple said apparatus to said at least a first microcomponent in a manner that constrains three degrees of translational freedom of said at least a first microcomponent relative to said apparatus without relying solely on frictional forces for constraining any one of said three degrees of translational freedom; and
    at least one latch mechanism for latching said at least one engagement member to a position for a desired coupling with said at least a first microcomponent.

16. The apparatus of claim 15 wherein said apparatus has a size of approximately one hundred microns by one hundred microns.

17. The apparatus of claim 15 wherein said apparatus is capable of engaging said at least a first microcomponent in a manner that further constrains rotational freedom of said at least a first microcomponent relative to said apparatus.

18. The apparatus of claim 15 further comprising:
    at leak one handle for aiding in positioning a gripper as said gripper applies a force against said at least one engagement member.

19. The apparatus of claim 15 wherein said at least one engagement member includes a barbed end.

20. The apparatus of claim 19 wherein said barbed end includes a retaining surface for engaging the underside of said receptacle when said apparatus is coupled with said at least a first microcomponent.

21. The apparatus of claim 15 further comprising:
    at least one constraining surface that is maintained flush against the upperside of said at least a first microcomponent when said apparatus is coupled with said at least a first microcomponent.

22. The apparatus of claim 15 wherein said position for a desired coupling is a position that enables said at least one engagement member to penetrate said receptacle without contacting the edges of said receptacle.

23. The apparatus of claim 15 wherein said position for a desired coupling is a position that enables said at least one engagement member to penetrate said receptacle with a minimal insertion force applied.

24. The apparatus of claim 15 further comprising:
    at least one release mechanism for releasing said at least one engagement member to enable said at least one engagement member to couple said apparatus with said at least a first microcomponent.

25. The apparatus of claim 24 wherein said at least one release mechanism is arranged to release said at least one engagement member as said at least one engagement member penetrates said receptacle of said at least a first microcomponent.

26. The apparatus of claim 25 wherein upon said release mechanism releasing said at least one engagement member, said at least one engagement member applies a force against said receptacle.

27. The apparatus of claim 24 further comprising two of said release mechanisms.

28. A microcomponent comprising:
   a connector for coupling with at least one other microcomponent in a manner that constrains at least three degrees of translational freedom of said at least one other microcomponent relative to said connector, without relying solely on frictional forces for constraining any one of said at least three degrees of translational freedom; and
   at least one latch mechanism for latching said at least one engagement member to a position for a desired coupling of said at least one other microcomponent.

29. The microcomponent of claim 28 wherein said microcomponent has a size no greater than approximately one centimeter by one centimeter.

30. The microcomponent of claim 28 wherein said connector has a size no greater than approximately two hundred microns by two hundred microns.

31. The microcomponent of claim 28 wherein said connector is a snap connector.

32. The microcomponent of claim 28 wherein said connector is a squeeze connector.

33. The microcomponent of claim 28 wherein said connector is capable of engaging said at least one other microcomponent in a manner that further constrains rotational freedom of said at least one other microcomponent relative to said connector.

34. The microcomponent of claim 28 wherein said connector further comprises at least one engagement member for penetrating a receptacle of at least a first microcomponent to couple said connector to said at least one other microcomponent.

35. The microcomponent of claim 34 wherein said connector further comprises at least one handle for aiding in positioning a gripper as said gripper applies a force against said at least one engagement member.

36. The microcomponent of claim 34 wherein said at least one engagement member includes a barbed end.

37. The microcomponent of claim 36 wherein said barbed end includes a retaining surface for engaging the underside of said receptacle when said connector is coupled with said at least one other microcomponent.

38. The microcomponent of claim 28 wherein said position for a desired coupling is a position that enables said at least one engagement member to penetrate said receptacle without contacting the edges of said receptacle.

39. The microcomponent of claim 28 wherein said position for a desired coupling is a position that enables said at least one engagement member to penetrate said receptacle with a minimal insertion force applied.

40. The microcomponent of claim 28 further comprising:
   at least one release mechanism for releasing said at least one engagement member to enable said at least one engagement member to couple said connector with said at least one other microcomponent.

41. The microcomponent of claim 40 wherein said at least one release mechanism is arranged to release said at least one engagement member as said at least one engagement member penetrates said receptacle of said at least one other microcomponent.

42. The microcomponent of claim 41 wherein upon said release mechanism releasing said at least one engagement member, said at least one engagement member applies a force against said receptacle.

43. The microcomponent of claim 28 further comprising:
   at least one constraining surface that is maintained flush against the upperside of said at least a first microcomponent when said connector is coupled with said at least a first microcomponent.

44. An apparatus for coupling microcomponents, comprising:
   at least one engagement member;
   at least one latch mechanism for latching said at least one engagement member to a position for a desired coupling with at least a first microcomponent, wherein said at least one latch mechanism is not reliant on a coupling to a substrate for latching said at least one engagement member; and
   at least one release mechanism for releasing said at least one engagement member operable after said engagement member is mated with said at least a first microcomponent.

45. The apparatus of claim 44 wherein said apparatus has a size no greater than approximately two hundred microns by two hundred microns.

46. The apparatus of claim 44 wherein said position for desired coupling is a position that enables said at least one engagement member to penetrate a receptacle of said at least a first microcomponent without contacting the edges of said receptacle.

47. The apparatus of claim 44 wherein said position for a desired coupling is a position that enables said at least one engagement member to penetrate a receptacle of said at least a first microcomponent with a minimal insertion force applied.

48. The apparatus of claim 44 wherein said apparatus is capable of engaging said at least a first microcomponent in a manner that constrains three degrees of translational freedom of said at least a first microcomponent relative to said apparatus.

49. The apparatus of claim 44 wherein said apparatus constrains rotational freedom of said at least a first microcomponent relative to said apparatus.

50. The apparatus of claim 44 wherein said at least one engagement member includes a barbed end.

51. The apparatus of claim 50 wherein said barbed end includes a retaining surface for engaging the underside of a receptacle of said at least a first microcomponent when said apparatus is coupled with said at least a first microcomponent.

52. The apparatus of claim 44 further comprising:
   at least one constraining surface that is maintained flush against the upperside of said at least a first microcomponent when said apparatus is coupled with said at least a first microcomponent.

53. The apparatus of claim 44 wherein said at least one release mechanism is arranged to release said at least one engagement member as said at least one engagement member penetrates a receptacle of said at least a first microcomponent.

54. The apparatus of claim 53 wherein upon said release mechanism releasing said at least one engagement member, said at least one engagement member applies a force against said receptacle.

55. The apparatus of claim 44 further comprising two of said release mechanisms.

56. A connector for coupling two microcomponents, comprising:
   at least one spring active in a direction substantially lateral to at least a first microcomponent;
   said at least one spring each forming an engagement member for penetrating a receptacle of said at least a first microcomponent;

at least one latch mechanism for latching said engagement members to a position for a desired coupling of said at least a first microcomponent;

each of said engagement members comprising a barbed end having a retention side for engaging the underside of said at least a first microcomponent when said connector is coupled to said microcomponent; and at least one constraining surface that is maintained flush against the upperside of said at least a first microcomponent when said connector is coupled with said at least a first microcomponent, wherein said connector is capable of engaging said at least a first microcomponent in a manner that constrains three degrees of translational freedom of said at least a first microcomponent relative to said connector without relying solely on frictional forces for constraining any one of said three degrees of said translational freedom.

57. The connector of claim 56 wherein said connector has a size of approximately one hundred microns by one hundred microns.

58. The connector of claim 56 wherein said connector is capable of engaging said at least a first microcomponent in a manner that constrains rotational freedom of said at least a first microcomponent relative to said connector.

59. The connector of claim 56 further comprising:
at least one handle for aiding in positioning a gripper as said gripper applies a force against said engagement members.

60. The connector of claim 56 wherein said position for a desired coupling is a position that enables said engagement members to penetrate said receptacle without contacting the edges of said receptacle.

61. The connector of claim 60 wherein said position for a desired coupling is a position that enables said engagement members to penetrate said receptacle with a minimal insertion force applied.

62. The connector of claim 56 further comprising:
at least one release mechanism for releasing said engagement members from said latch mechanism to enable said engagement members to couple said connector with said at least a first microcomponent.

63. The connector of claim 62 wherein said at least one release mechanism is arranged to release said engagement members from said latch mechanism as said engagement members penetrate said receptacle of said at least a first microcomponent.

64. The connector of claim 63 wherein upon said release mechanism releasing said engagement members, said engagement members apply a force against said receptacle.

65. An apparatus for coupling and decoupling microcomponents, comprising:
at least one engagement member for engaging a receptacle of at least a first microcomponent;
said at least one engagement member implemented to enable said at least one engagement member to be pressure fit with said receptacle to couple said apparatus with said at least a first microcomponent, wherein said apparatus engages said at least a first microcomponent in a manner that constrains three degrees of translational freedom of said at least a first microcomponent relative to said apparatus without relying solely on frictional forces for constraining any one of said three degrees of translational freedom; and
said at least one engagement member further implemented to enable said at least one engagement member to be disengaged from said receptacle to decouple said apparatus from said at least a first microcomponent.

66. The apparatus of claim 65 wherein said apparatus has a size of approximately one hundred microns by one hundred microns.

67. The apparatus of claim 65 having a size no greater than one millimeter by one millimeter.

68. The apparatus of claim 65 wherein said apparatus engages said at least a first microcomponent in a manner that constrains rotational freedom of said at least a first microcomponent relative to said apparatus.

69. The apparatus of claim 65 wherein said apparatus comprises at least one spring biased to cause said at least one engagement member to apply a force against said receptacle of said at least a first microcomponent when said apparatus is coupled thereto to pressure fit said at least one engagement member with said receptacle.

70. The connector of claim 1 wherein said at least one latch mechanism is not reliant on a coupling to a substrate for latching said at least one engagement member.

71. The connector of claim 11 wherein said at least one release mechanism is not reliant on a coupling to a substrate for releasing said at least one engagement member.

72. The apparatus of claim 15 wherein said at least one latch mechanism is not reliant on a coupling to a substrate for latching said at least one engagement member.

73. The apparatus of claim 24 wherein said at least one release mechanism is not reliant on a coupling to a substrate for releasing said at least one engagement member.

74. The microcomponent of claim 28 wherein said at least one latch mechanism is not reliant on a coupling to a substrate for latching said at least one engagement member.

75. The microcomponent of claim 40 wherein said at least one release mechanism is not reliant on a coupling to a substrate for releasing said at least one engagement member.

76. The apparatus of claim 44 wherein said at least one release mechanism is not reliant on a coupling to a substrate for releasing said at least one engagement member.

77. The apparatus of claim 48 wherein said manner that constrains three degrees of translational freedom of said at least a first microcomponent relative to said apparatus does not rely solely on frictional forces for constraining any one of said three degrees of translational freedom.

78. The connector of claim 56 wherein said connector engages said at least a first microcomponent in a direction of each of said three degrees of translational freedom.

79. The connector of claim 56 wherein said engagement member engages said receptacle to constrain said at least a first microcomponent in at least two degrees of translational freedom, and said constraining surface and said barbed ends engage said at least a first microcomponent to constrain a third degree of translational freedom of said at least a first microcomponent.

80. The connector of claim 56 wherein said connector engages said at least a first microcomponent in three directions that are each substantially orthogonal to one another.

81. The connector of claim 56 wherein said at least one latch mechanism is not reliant on a coupling to a substrate for latching said engagement members.

82. The connector of claim 56 wherein said connector is not anchored to a substrate on which it was fabricated.

83. The connector of claim 56 wherein said connector is not anchored to a substrate.

84. The connector of claim 62 wherein said at least one release mechanism is not reliant on a coupling to a substrate for releasing said engagement members.

85. The apparatus of claim 65 wherein said apparatus is not anchored to a substrate on which it was fabricated.

86. The apparatus of claim 65 wherein said apparatus is not anchored to a substrate.

87. A connector that is not anchored to a substrate on which said connector was fabricated, said connector capable of coupling with at least a first microcomponent in a manner that constrains at least three degrees of translational freedom of said at least a first microcomponent relative to said connector, and said connector comprising:

at least one engagement member for engaging said at least a first microcomponent; and at least one latch mechanism for latching said at least one engagement member to a latched position.

88. The connector of claim 87 wherein said connector is not anchored to any substrate.

89. The connector of claim 81 wherein said at least a first microcomponent is anchored to a substrate.

90. The connector of claim 87 wherein said connector does not rely solely on frictional forces for constraining any one of said at least three degrees of translational freedom.

91. The connector of claim 87 further comprising:

at least one release mechanism for releasing said at least one engagement member from said latched position.

92. A system comprising:

at least one microcomponent; and a micro-connector that is capable of coupling to said at least one microcomponent in a manner that constrains at least three degrees of translational freedom of said at least one microcomponent relative to said connector without relying solely on frictional forces for constraining any one of said at least three degrees of translational freedom, said microconnector comprising at least one engagement member for engaging said at least one microcomponent, and at least one latch mechanism for latching said at least one engagement member to a latched position.

93. The system of claim 92 wherein said micro-connector is not anchored to a substrate on which it was fabricated.

94. The system of claim 92 wherein said micro-connector is not anchored to a substrate.

95. The system of claim 92 wherein said at least one latch mechanism is not reliant on a coupling to a substrate for latching said at least one engagement member.

96. The system of claim 92 further comprising:

at least one release mechanism for releasing said at least one engagement member from said latched position.

97. The system of claim 92 wherein said at least one microcomponent has a size no greater than one centimeter by one centimeter.

\* \* \* \* \*